(12) United States Patent
Kubota et al.

(10) Patent No.: US 12,108,165 B2
(45) Date of Patent: Oct. 1, 2024

(54) IMAGING DEVICE INCLUDING PIXELS EACH HAVING A LIGHT-RECEIVING DEVICE AND A LIGHT-EMITTING DEVICE

(71) Applicant: SEMICONDUCTOR ENERGY LABORATORY CO., LTD., Atsugi (JP)

(72) Inventors: Daisuke Kubota, Kanagawa (JP); Ryo Hatsumi, Kanagawa (JP); Taisuke Kamada, Saitama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 219 days.

(21) Appl. No.: 17/639,683

(22) PCT Filed: Sep. 1, 2020

(86) PCT No.: PCT/IB2020/058112
§ 371 (c)(1),
(2) Date: Mar. 2, 2022

(87) PCT Pub. No.: WO2021/048683
PCT Pub. Date: Mar. 18, 2021

(65) Prior Publication Data
US 2022/0294981 A1 Sep. 15, 2022

(30) Foreign Application Priority Data
Sep. 13, 2019 (JP) .................................. 2019-167577

(51) Int. Cl.
*H04N 23/80* (2023.01)
*G06T 5/50* (2006.01)
(Continued)

(52) U.S. Cl.
CPC ............... *H04N 23/80* (2023.01); *G06T 5/50* (2013.01); *G06T 5/80* (2024.01); *H04N 23/125* (2023.01);
(Continued)

(58) Field of Classification Search
None
See application file for complete search history.

(56) References Cited

U.S. PATENT DOCUMENTS 8,378,391 B2 2/2013 Koyama et al.
8,847,245 B2 9/2014 Kurokawa
(Continued)

FOREIGN PATENT DOCUMENTS

CN 105981377 A 9/2016
JP 06-142038 A 5/1994
(Continued)

OTHER PUBLICATIONS

International Search Report (Application No. PCT/IB2020/058112) Dated Dec. 8, 2020.
(Continued)

*Primary Examiner* — Paul M Berardesca
(74) *Attorney, Agent, or Firm* — Fish & Richardson P.C.

(57) ABSTRACT

A thin lightweight imaging device is provided. A highly convenient imaging device is provided. The imaging unit includes an imaging unit, a memory, and an arithmetic circuit. The imaging unit includes a light-receiving device, a first light-emitting device, and a second light-emitting device. The first light-emitting device has a function of emitting light in a wavelength range that is different from a wavelength range of light emitted by the second light-emitting device. The imaging unit has a function of making the first light-emitting device emit light and acquiring first image data. The imaging unit has a function of making the
(Continued)

second light-emitting device emit light and acquiring second image data. The memory has a function of retaining the first reference data and the second reference data. The arithmetic circuit has a function of correcting the first image data with the use of the first reference data retained in the memory and calculating first correction image data. The arithmetic circuit has a function of correcting the second image data with the use of the second reference data retained in the memory and calculating second correction image data. The arithmetic circuit has a function of combining the first correction image data and the second correction image data to generate synthesized image data. The light-receiving device includes a first pixel electrode, and the first light-emitting device includes a second pixel electrode on the same plane as the first pixel electrode.

6 Claims, 19 Drawing Sheets

(51) Int. Cl.
| | |
|---|---|
| *G06T 5/80* | (2024.01) |
| *H04N 23/10* | (2023.01) |
| *H04N 23/56* | (2023.01) |
| *H04N 25/10* | (2023.01) |
| *H10K 65/00* | (2023.01) |

(52) U.S. Cl.
CPC ............. *H04N 23/56* (2023.01); *H04N 25/10* (2023.01); *H10K 65/00* (2023.02); *G06T 2207/20212* (2013.01)

(56) References Cited

U.S. PATENT DOCUMENTS

| | | | |
|---|---|---|---|
| 8,916,869 B2 | 12/2014 | Koyama et al. | |
| 9,331,112 B2 | 5/2016 | Koyama et al. | |
| 9,455,287 B2 | 9/2016 | Kurokawa | |
| 9,773,814 B2 | 9/2017 | Koyama et al. | |
| 10,284,758 B2 | 5/2019 | Toda | |
| 10,419,693 B2 | 9/2019 | Yamamoto et al. | |
| 10,455,174 B2 | 10/2019 | Ikeda | |
| 11,217,635 B2 | 1/2022 | Ikeda et al. | |
| 2002/0074551 A1* | 6/2002 | Kimura ................ | H04N 1/028 |
| | | | 438/149 |
| 2007/0029554 A1* | 2/2007 | Nakamura ......... | H10K 59/1275 |
| | | | 257/E27.111 |
| 2015/0373243 A1 | 12/2015 | Toda | |
| 2016/0360125 A1 | 12/2016 | Yamamoto et al. | |
| 2018/0151639 A1* | 5/2018 | Luo ...................... | H10K 59/60 |
| 2020/0111193 A1* | 4/2020 | Rephaeli ............. | H04N 23/125 |
| 2021/0327979 A1 | 10/2021 | Kamada et al. | |
| 2022/0173174 A1* | 6/2022 | Hatsumi ............... | H10K 59/65 |
| 2023/0251743 A1* | 8/2023 | Yamazaki ............. | G06F 3/041 |
| | | | 345/175 |

FOREIGN PATENT DOCUMENTS

| | | |
|---|---|---|
| JP | 2011-119711 A | 6/2011 |
| WO | WO-2014/125945 | 8/2014 |
| WO | WO-2015/125553 | 8/2015 |

OTHER PUBLICATIONS

Written Opinion (Application No. PCT/IB2020/058112) Dated Dec. 8, 2020.

* cited by examiner

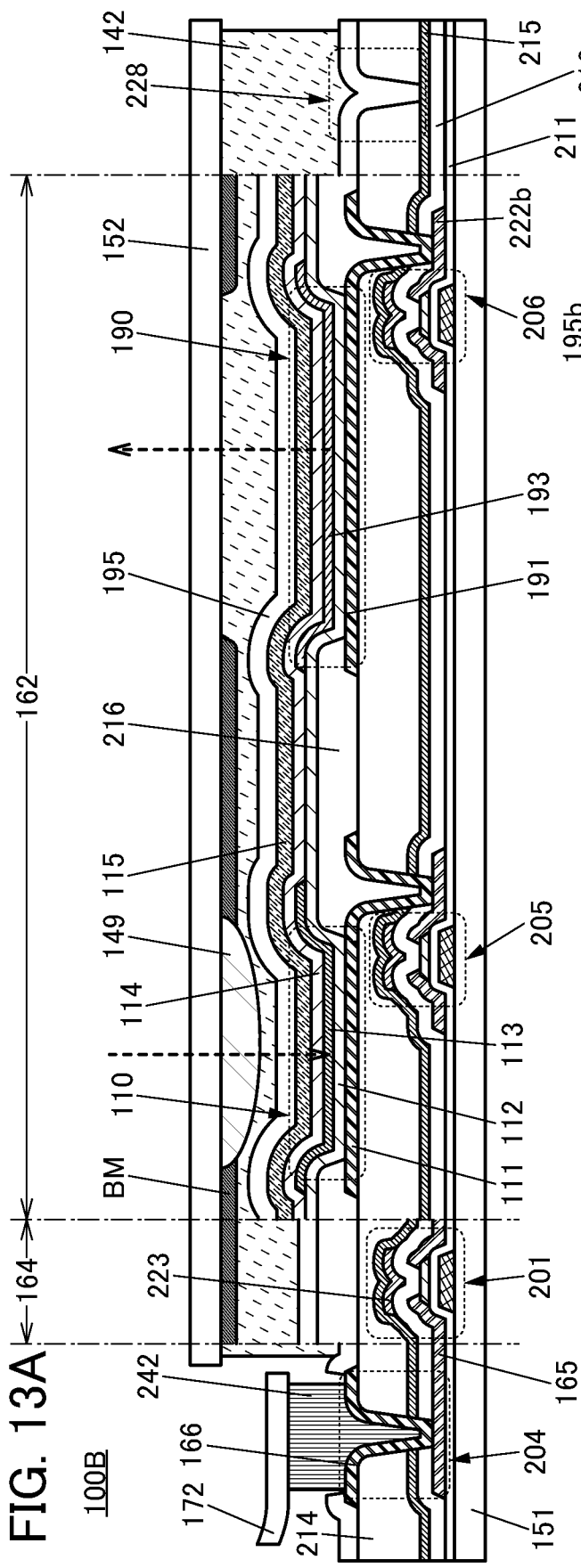
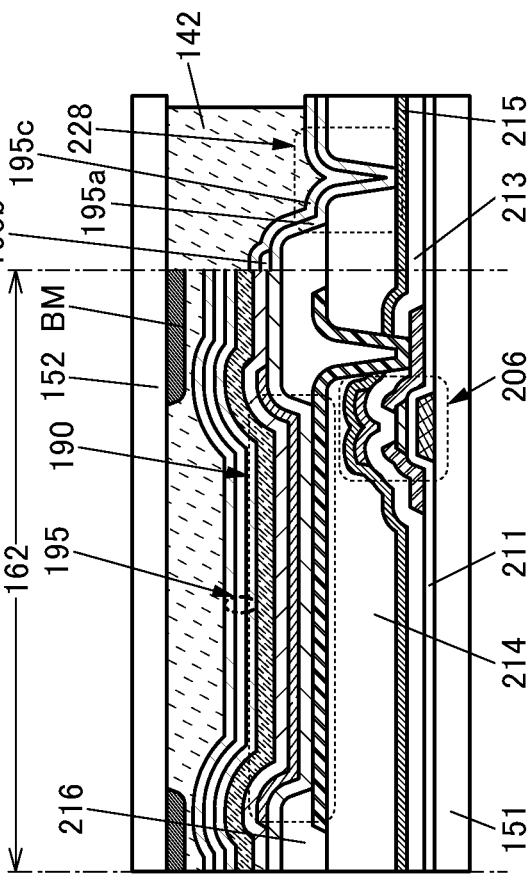
FIG. 13A
FIG. 13B

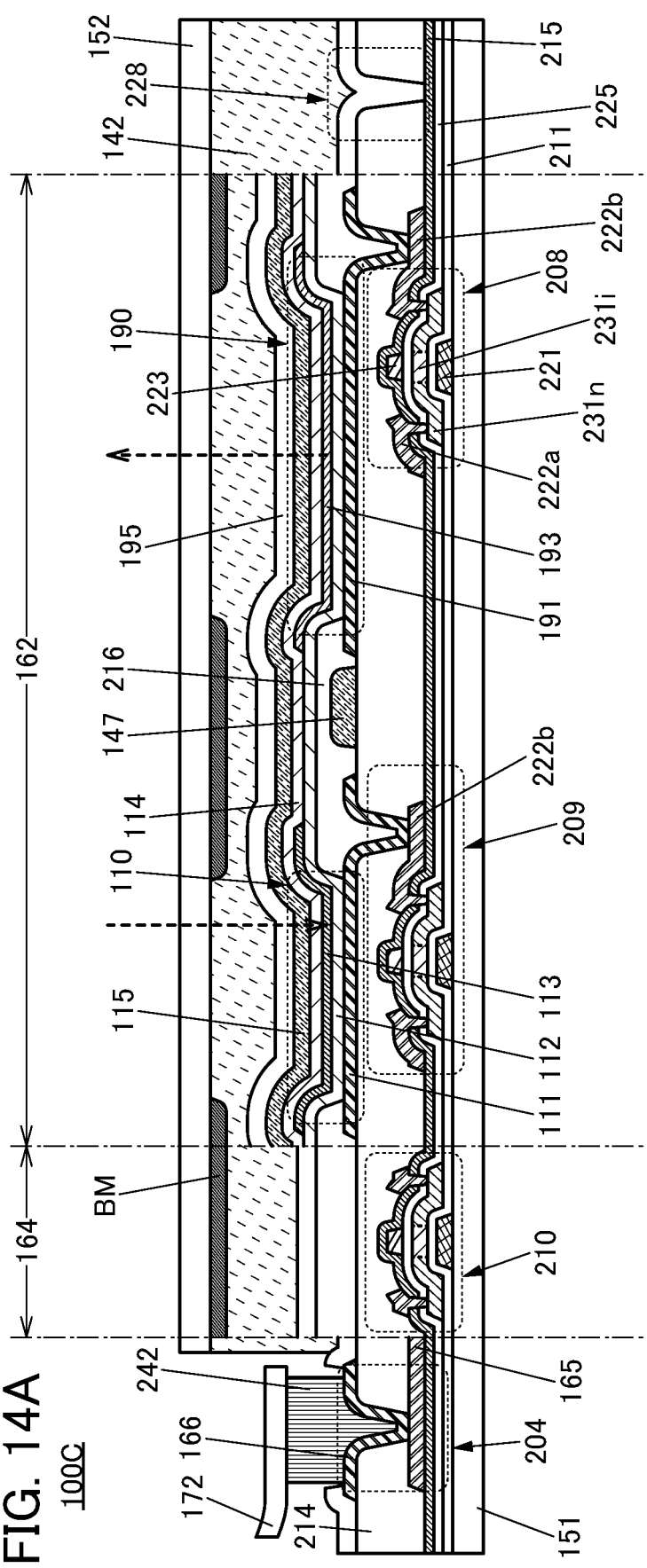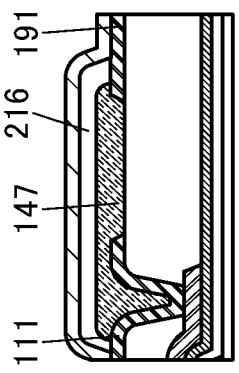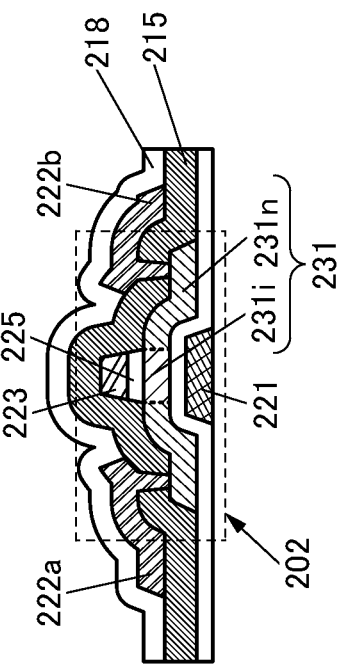
FIG. 14A
100C
FIG. 14C
FIG. 14B

IMAGING DEVICE INCLUDING PIXELS EACH HAVING A LIGHT-RECEIVING DEVICE AND A LIGHT-EMITTING DEVICE

CROSS REFERENCE TO RELATED APPLICATIONS

This application is a U.S. National Phase Application under 35 U.S.C. § 371 of International Application PCT/IB2020/058112, filed on Sep. 1, 2020, which is incorporated by reference and claims the benefit of a foreign priority application filed in Japan on Sep. 13, 2019, as Application No. 2019-167577.

TECHNICAL FIELD

One embodiment of the present invention relates to an imaging device, an imaging module, an electronic device, and an imaging method.

Note that one embodiment of the present invention is not limited to the above technical field. Examples of the technical field of one embodiment of the present invention include a semiconductor device, a display device, a light-emitting apparatus, a power storage device, a memory device, an electronic device, a lighting device, an input device (e.g., a touch sensor), an input/output device (e.g., a touch panel), a driving method thereof, and a manufacturing method thereof. A semiconductor device generally means a device that can function by utilizing semiconductor characteristics.

BACKGROUND ART

A technique for forming a transistor by using an oxide semiconductor thin film formed over a substrate has attracted attention. For example, an imaging device with a structure in which a transistor that includes an oxide semiconductor and has an extremely low off-state current is used in a pixel circuit is disclosed in Patent Document 1.

REFERENCE

Patent Document

[Patent Document 1] Japanese Published Patent Application No. 2011-119711

SUMMARY OF THE INVENTION

Problems to be Solved by the Invention

An object of one embodiment of the present invention is to provide a thin lightweight imaging device. An object of one embodiment of the present invention is to provide an imaging device capable of forming a high-resolution image by imaging. An object of one embodiment of the present invention is to provide an imaging device capable of forming a high-quality image by imaging. An object of one embodiment of the present invention is to provide a multifunctional imaging device. An object of one embodiment of the present invention is to provide a highly convenient imaging device. An object of one embodiment of the present invention is to provide an imaging device with high color reproducibility. An object of one embodiment of the present invention is to provide a novel imaging device. An object of one embodiment of the present invention is to provide an imaging method with high color reproducibility. An object of one embodiment of the present invention is to provide a novel imaging method.

Note that the description of these objects does not preclude the existence of other objects. One embodiment of the present invention does not need to achieve all the objects. Other objects can be derived from the description of the specification, the drawings, and the claims.

Means for Solving the Problems

One embodiment of the present invention is an imaging device including an imaging unit, a memory, and an arithmetic circuit. The imaging unit includes a light-receiving device, a first light-emitting device, and a second light-emitting device. The first light-emitting device has a function of emitting light in a wavelength range that is different from a wavelength range of light emitted by the second light-emitting device. The imaging unit has a function of making the first light-emitting device emit light and acquiring first image data. The imaging unit has a function of making the second light-emitting device emit light and acquiring second image data. The memory has a function of retaining the first reference data and the second reference data. The arithmetic circuit has a function of correcting the first image data with the use of the first reference data retained in the memory and calculating first correction image data. The arithmetic circuit has a function of correcting the second image data with the use of the second reference data retained in the memory and calculating second correction image data. The arithmetic circuit has a function of combining the first correction image data and the second correction image data to generate synthesized image data. The light-receiving device includes a first pixel electrode, and the first light-emitting device includes a second pixel electrode on the same plane as the first pixel electrode.

In the above imaging device, the light-receiving device further includes an active layer and a common electrode, and the first light-emitting device further includes a light-emitting layer and the common electrode. The active layer is positioned over the first pixel electrode and includes a first organic compound. The light-emitting layer is positioned over the second pixel electrode and includes a second organic compound. The common electrode includes a portion overlapping with the first pixel electrode with the active layer therebetween and a portion overlapping with the second pixel electrode with the light-emitting layer therebetween.

In the above imaging device, the imaging unit preferably further includes a lens. The lens includes a portion overlapping with the light-receiving device and is positioned over the first pixel electrode. Light passing through the lens preferably enters the light-receiving device.

One embodiment of the present invention is an imaging module including the above imaging device and at least any one or more of the connector and the integrated circuit.

One embodiment of the present invention is an electronic device including the above imaging module and at least any one or more of an antenna, a battery, a housing, a camera, a speaker, a microphone, and an operation button.

One embodiment of the present invention is an imaging method including: the step of making a first light-emitting device emit light and acquiring first image data; the step of correcting the first image data with the use of first reference data and calculating first correction image data; the step of making a second light-emitting device emit light and acquiring second image data; the step of correcting the second image data with the use of second reference data and calculating second correction image data; and the step of combining the first correction image data and the second correction image data and generating synthesized image data. The first light-emitting device has a function of emitting light in a wavelength range that is different from a wavelength range of light emitted by the second light-emitting device.

Effect of the Invention

According to one embodiment of the present invention, a thin lightweight imaging device can be provided. According to one embodiment of the present invention, an imaging device capable of forming a high-resolution image by imaging can be provided. According to one embodiment of the present invention, an imaging device capable of forming a high-quality image by imaging can be provided. According to one embodiment of the present invention, a multifunctional imaging device can be provided. According to one embodiment of the present invention, a highly convenient imaging device can be provided. According to one embodiment of the present invention, an imaging device with high color reproducibility can be provided. According to one embodiment of the present invention, a novel imaging device can be provided. According to one embodiment of the present invention, an imaging method with high color reproducibility can be provided. According to one embodiment of the present invention, a novel imaging method can be provided.

Note that the description of these effects does not preclude the existence of other effects. One embodiment of the present invention does not need to have all these effects. Other effects can be derived from the description of the specification, the drawings, and the claims.

BRIEF DESCRIPTION OF THE DRAWINGS

FIG. 13A and FIG. 13B are cross-sectional views each showing an example of an imaging device.

FIG. 14A to FIG. 14C are cross-sectional views each showing an example of an imaging device.

MODE FOR CARRYING OUT THE INVENTION

Figure 1:
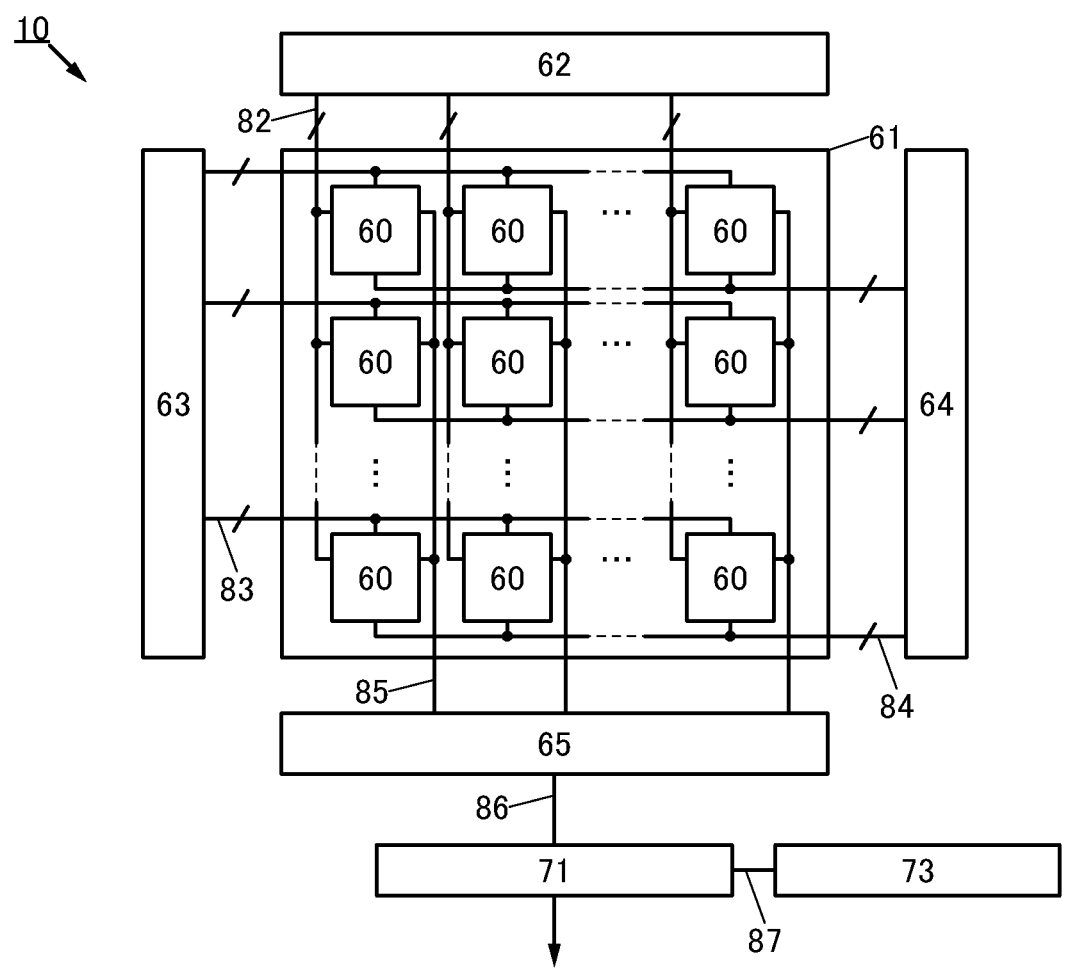
FIG. 1 is a block diagram showing an example of an imaging device.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the description in the following embodiments.

Note that in structures of the present invention described below, the same portions or portions having similar functions are denoted by the same reference numerals in different drawings, and a description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be changed into the term "conductive film". As another example, the term "insulating film" can be changed into the term "insulating layer".

Embodiment 1

One embodiment of the present invention is an imaging device including an imaging unit, a memory, and an arithmetic circuit. The imaging unit includes a light-emitting device (also referred to as a light-emitting element) and a light-receiving device (also referred to as a light-receiving element). Specifically, light-emitting devices and light-receiving devices are arranged in a matrix in the imaging unit, and the light-emitting devices emit light and the light-receiving devices receive light reflected from the subject. The memory has a function of retaining reference data. The arithmetic circuit has a function of correcting image data output from the light-receiving device with the use of the reference data and calculating correction image data. The imaging device of one embodiment of the present invention has the following functions: making light-emitting devices of different colors sequentially emit light for imaging; calculating correction image data by correcting each of image data obtained from images formed by the imaging with the light of the respective colors; and combining the correction image data to generate synthesized image data. The imaging device of one embodiment of the present invention can display a synthesized image on the imaging unit, on the basis of the synthesized image data.

The light-emitting device preferably emits light in the visible light wavelength range. As the light-emitting device, an EL element such as an OLED (Organic Light-Emitting Diode) and a QLED (Quantum-dot Light-Emitting Diode) is preferably used. As a light-emitting substance included in the EL element, a substance which emits fluorescent light (a fluorescent material), a substance which emits phosphorescent light (a phosphorescent material), an inorganic compound (e.g., a quantum dot material), a substance which exhibits thermally activated delayed fluorescence (a thermally activated delayed fluorescent (TADF) material), and the like can be given. An LED such as a micro-LED (Light Emitting Diode) can be used as the light-emitting device.

The light-receiving device preferably has sensitivity in the visible light wavelength range. In particular, a light-receiving device having sensitivity in the whole visible light wavelength range is preferably used. As the light-receiving device, a PN photodiode or a PIN photodiode can be used, for example. The light-receiving device functions as a photoelectric conversion element that senses light incident on the light-receiving device and generates charge. The amount of generated electric charge depends on the amount of light entering the light-receiving device.

It is particularly preferable to use an organic photodiode including a layer containing an organic compound as the light-receiving device. An organic photodiode, which is easily made thin, lightweight, and large in area and has a high degree of freedom for shape and design, can be used in a variety of imaging devices.

In one embodiment of the present invention, an organic EL element is preferably used as the light-emitting device, and an organic photodiode is used as the light-receiving device. The structure of the organic photodiode can have many layers shared with the organic EL elements. Accordingly, the light-emitting device and light-receiving device can be incorporated in the imaging device without a significant increase in the number of manufacturing steps. For example, an active layer of a light-receiving device and a light-emitting layer of a light-emitting device are separately formed, and the other layers can be shared by the light-emitting device and the light-receiving device. Accordingly, the imaging device can be thin and lightweight. Note that a layer shared by the light-receiving device and the light-emitting device may have functions different in the light-receiving device and the light-emitting device. In this specification, the name of a component is based on its function in the light-emitting device. For example, a hole-injection layer functions as a hole-injection layer in the light-emitting device and functions as a hole-transport layer in the light-receiving device. Similarly, an electron-injection layer functions as an electron-injection layer in the light-emitting device and functions as an electron-transport layer in the light-receiving device.

As the light-emitting devices, a light-emitting device emitting light in a red wavelength range, a light-emitting device emitting light in a green wavelength range, and a light-emitting device emitting light in a blue wavelength range can be used, for example. These light-emitting devices are sequentially made to emit light and the light-receiving devices sense the light reflected, which enables a color image of the subject to be obtained. Thus, the imaging device of one embodiment of the present invention can be used as a color image scanner. In the imaging device of one embodiment of the present invention, image data obtained from an image formed by imaging with light of each color is corrected to calculate correction image data, and pieces of such correction image data are combined, whereby a synthesized image data can be generated. In other words, even when the light-receiving devices do not have a spectroscopy function, the imaging device can achieve high color reproducibility. By using a light-emitting device with high color reproducibility, the imaging device can achieve higher color reproducibility.

In this specification and the like, a blue wavelength range is greater than or equal to 400 nm and less than 490 nm, and blue light has at least one emission spectrum peak in the wavelength range. A green wavelength range of green is greater than or equal to 490 nm and less than 580 nm, and green light has at least one emission spectrum peak in the wavelength range. A red wavelength range is greater than or equal to 580 nm and less than or equal to 680 nm, and red light has at least one emission spectrum peak in that wavelength range.

Since the imaging device of one embodiment of the present invention employs a light-receiving device having sensitivity in the whole visible light wavelength range, it is not necessary to independently provide a red-light-receiving device, a green-light-receiving device, and a blue-light-receiving device, which allows imaging for a high-resolution image. The imaging device of one embodiment of the present invention can also have a function of displaying an image because light-emitting devices are included, and thus the imaging device can be highly convenient and have several functions. For example, an image formed by imaging by the imaging unit is displayed on the imaging unit, whereby the image formed by imaging can be checked immediately.

The imaging device of one embodiment of the present invention can be applied to a display portion of an electronic device. For example, a television device, a personal computer, a monitor for a computer or the like, digital signage, a mobile phone, a portable game machine, a portable information terminal, or the like can be used as the electronic device. When the imaging device of one embodiment of the present invention is applied to a display portion in an electronic device, the display portion can have an imaging function. The user can perform imaging by putting the imaging subject on the display portion in the electronic device. The image formed by imaging is immediately displayed on the display portion, so that the user can also check the image; thus, the electronic device can be highly convenient. The imaging device of one embodiment of the present invention can be applied to individual authentication when the light-receiving device images biological information such as a fingerprint or a palm print. The imaging device of one embodiment of the present invention can also be applied to a touch sensor when the positional information of a target object that touches the imaging unit is sensed.

The imaging device of one embodiment of the present invention is described with reference to FIG. 1 to FIG. 15.

Structure Example 1 of Imaging Device

FIG. 1 is a block diagram illustrating an imaging device 10 of one embodiment of the present invention. The imaging device 10 includes an imaging unit 61, a driver circuit portion 62, a driver circuit portion 63, a driver circuit portion 64, and a circuit portion 65.

The imaging unit 61 includes pixels 60 arranged in a matrix. The pixels 60 each include a light-emitting device and a light-receiving device. The light-receiving device may be provided in all of the pixels 60 or in some of the pixels 60. In addition, one pixel 60 may include a plurality of light-receiving devices.

The driver circuit portion 62 functions as a source line driver circuit (also referred to as a source driver). The driver circuit portion 63 functions as a gate line driver circuit (also referred to as a gate driver). The driver circuit portion 64 generates a signal for driving the light-receiving device included in the pixel 60 and outputting the signal to the pixel 60. The circuit portion 65 has a function of receiving a signal output from the pixel 60 and outputting the signal as data to the arithmetic circuit 71. The circuit portion 65 functions as a reading circuit. The arithmetic circuit 71 has a function of receiving a signal output from the circuit portion 65 and performing an arithmetic operation. The memory 73 has a function of storing a program executed by the arithmetic circuit 71, data input to the arithmetic circuit 71, data output from the arithmetic circuit 71, and the like.

As the arithmetic circuit 71, for example, a CPU (Central Processing Unit), a DSP (Digital Signal Processor), a GPU (Graphics Processing Unit), or the like can be used. A structure may be employed in which the above is obtained with a PLD (Programmable Logic Device) such as an FPGA (Field Programmable Gate Array) or an FPAA (Field Programmable Analog Array).

As the memory 73, a memory device including a non-volatile memory element can be suitably used. As the memory 73, for example, a flash memory, an MRAM (Magnetoresistive Random Access Memory), a PRAM (Phase change RAM), a ReRAM (Resistive RAM), an FeRAM (Ferroelectric RAM), or the like can be used.

The driver circuit portion 62 is electrically connected to the pixel 60 through a wiring 82. The driver circuit portion 63 is electrically connected to the pixel 60 through a wiring 83. The driver circuit portion 64 is electrically connected to the pixel 60 through a wiring 84. The circuit portion 65 is electrically connected to the pixel 60 through a wiring 85. The arithmetic circuit 71 is electrically connected to the circuit portion 65 through a wiring 86. The memory 73 is electrically connected to the arithmetic circuit 71 through a wiring 87.

Figure 2A:
FIG. 2A to FIG. 2C are top views showing examples of a pixel.

Each of the pixels 60 preferably includes two or more subpixels. The pixel 60 preferably includes a subpixel including the light-emitting device and a subpixel including the light-receiving device. FIG. 2A shows an example of the pixel 60. FIG. 2A shows an example in which the pixel 60 includes four subpixels, a subpixel 60R, a subpixel 60G, a subpixel 60B, and a subpixel 60PD. For example, the subpixel 60R includes a light-emitting device 91R that emits light in a red wavelength range, the subpixel 60G includes a light-emitting device 91G that emits light in a green wavelength range, the subpixel 60B includes a light-emitting device 91B that emits light in a blue wavelength range, and the subpixel 60PD includes a light-receiving device 91PD.

Figure 2B:
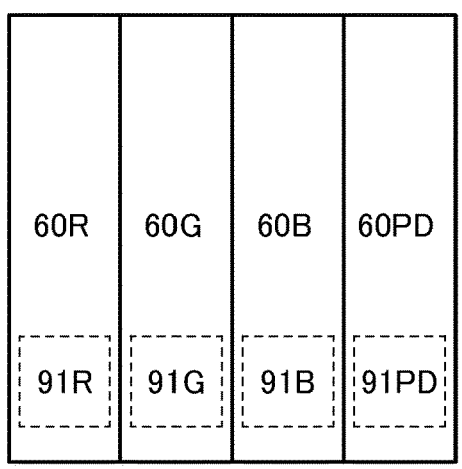

Although, as the pixels 60, four subpixels are arranged in a matrix of two rows and two columns in the example in FIG. 2A, one embodiment of the present invention is not limited thereto. Four subpixels may be arranged in a row, as illustrated in FIG. 2B. In addition, there is no particular limitation on the arrangement order of the subpixels.

Figure 2C:
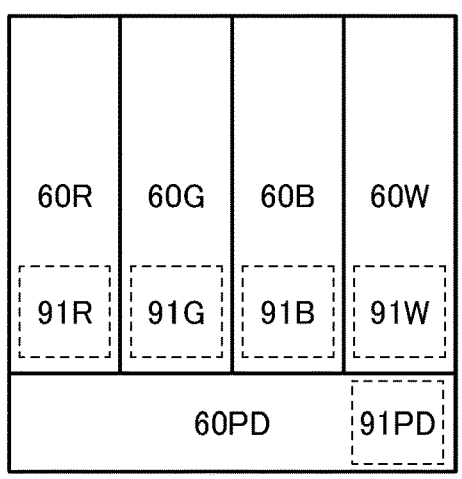

Although the colors of light emitted by the subpixels are three, red (R), green (G), and blue (B) in the example in FIG. 2A and FIG. 2B, the combination of the colors and the number of the colors are not limited thereto. Four colors, red (R), green (G), blue (B), and white (W), or four colors, red (R), green (G), blue (B), and yellow (Y) may be possible. FIG. 2C shows an example in which the pixel 60 includes five subpixels, the subpixel 60R, the subpixel 60G, the subpixel 60B, a subpixel 60W, and the subpixel 60PD and the subpixel 60W includes a light-emitting device 91W which emits white light. Note that color elements used for the subpixels are not limited to the above, and may be combined with cyan (C), magenta (M), or the like. Although the areas of the subpixels are equal to each other in the examples in FIG. 2A to FIG. 2C, one embodiment of the present invention is not limited thereto. The areas of the subpixels may be different from each other.

FIG. 3A to FIG. 3D each show a schematic cross-sectional view of the imaging unit 61.

Figure 3A:
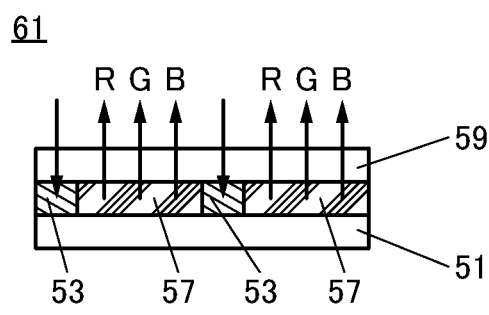
FIG. 3A to FIG. 3D are cross-sectional views showing examples of an imaging device.

The imaging unit 61 in FIG. 3A includes a substrate 51 and a substrate 59 and includes a layer 53 and a layer 57 between the substrate 51 and the substrate 59. The layer 57 includes a light-emitting device such as the light-emitting device 91R, and the layer 53 includes the light-receiving device 91PD.

Figure 3B:
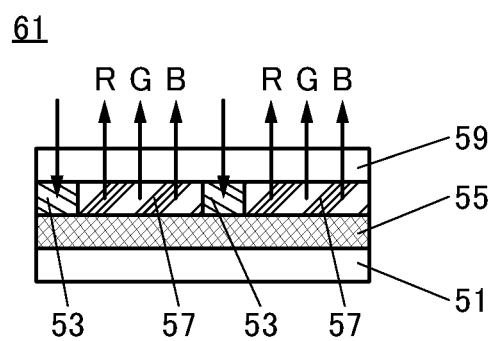

The imaging unit 61 in FIG. 3B includes the substrate 51 and the substrate 59 and includes the layer 53, a layer 55, and the layer 57 between the substrate 51 and the substrate 59. The layer 55 includes a transistor.

In the imaging unit 61, for example, red (R), green (G), and blue (B) light is emitted from the layer 57 including the light-emitting devices such as the light-emitting device 91R and light from the outside enters the layer 53 including the light-receiving device 91PD. Note that in FIG. 3A and FIG. 3B, the light that is emitted from the layer 57 and then enters the layer 53 is indicated by arrows.

The layer 55 including a transistor preferably includes a first transistor and a second transistor. The first transistor is electrically connected to the light-receiving device 91PD included in the layer 53. The second transistor is electrically connected to the light-emitting device such as the light-emitting device 91R included in the layer 57.

Figure 3C:
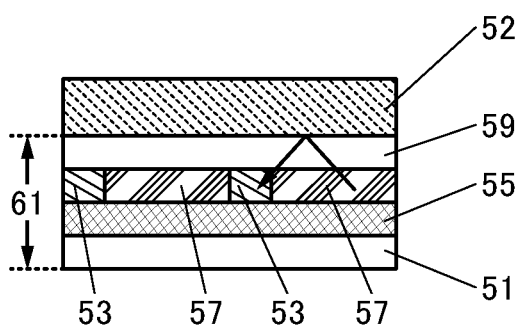

The imaging device of one embodiment of the present invention has a function of imaging the subject that touches the imaging unit 61. For example, as illustrated in FIG. 3C, the light-emitting device included in the layer 57 emits light, a subject 52 touching the imaging unit 61 reflects the light, and the light-receiving device 91PD included in the layer 53 receives the reflected light. Thus, the subject 52 over the imaging unit 61 can be imaged.

Figure 3D:
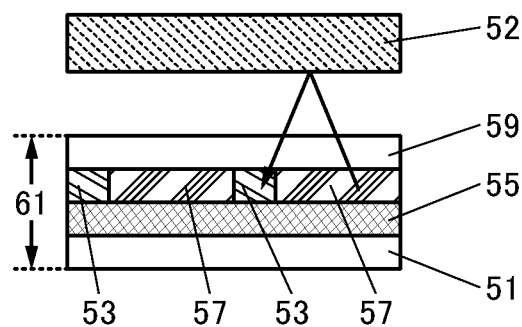

The imaging device of one embodiment of the present invention can also image the subject 52 that does not touch the imaging unit 61, as illustrated in FIG. 3D. Also with the imaging unit 61 illustrated in FIG. 3A, the subject 52 that does not touch the imaging unit 61 can be imaged. Note that in FIG. 3C and FIG. 3D, the light that is emitted from the layer 57 and reflected by the subject 52 and enters the layer 53 is indicated by an arrow.

Figure 4:
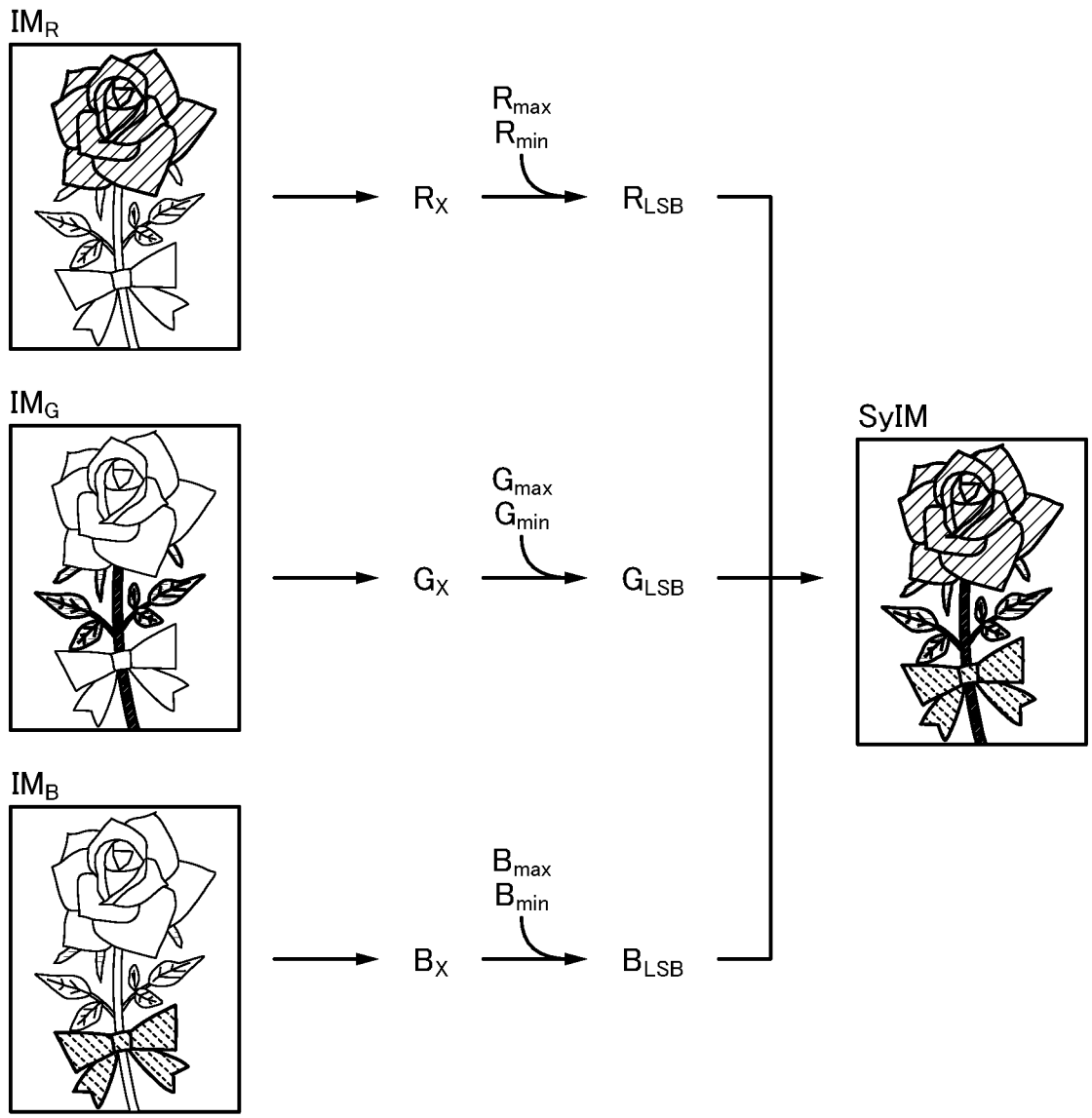
FIG. 4 is a conceptual diagram showing an operation of an imaging device.

An operation of the imaging device is described with reference to FIG. 1 and FIG. 4. FIG. 4 is a conceptual diagram illustrating the operation of the imaging device. Here, description is made with reference to an example in which imaging is performed using the light-emitting devices of three colors, the light-emitting device 91R that exhibits a red color, the light-emitting device 91G that exhibits a green color, and the light-emitting device 91B that exhibits a blue color, which are illustrated in FIG. 2A and FIG. 2B.

In the imaging unit 61, the light-emitting device 91R that emits red light is turned on, and a first image $IM_R$ is formed by imaging using the light-receiving device 91PD. A signal from the light-receiving device 91PD in each pixel (hereinafter, referred to as first image data $R_x$) is output to the arithmetic circuit 71 through the circuit portion 65. In the imaging unit 61, the light-emitting device 91G that emits green light is also turned on, and a second image $IM_G$ is formed by imaging using the light-receiving device 91PD. A signal from the light-receiving device 91PD in each pixel (hereinafter, referred to as second image data $G_X$) is output to the arithmetic circuit 71 through the circuit portion 65. In the imaging unit 61, the light-emitting device 91B that emits blue light is also turned on, and a third image $IM_B$ is formed by imaging using the light-receiving device 91PD. A signal from the light-receiving device 91PD in each pixel (hereinafter, referred to as third image data $B_X$) is output to the arithmetic circuit 71 through the circuit portion 65.

In the arithmetic circuit 71, the first image data $R_X$, the second image data $G_X$, and the third image data $B_X$ are each corrected. The arithmetic circuit 71 corrects the first image data $R_X$ with use of the reference data and calculates first correction image data $R_{LSB}$. The arithmetic circuit 71 corrects the second data $G_X$ with use of the reference data and calculates second correction image data $G_{LSB}$. The arithmetic circuit 71 corrects the third image data $B_X$ with use of the reference data and calculates third correction image data $B_{LSB}$.

Here, the reference data is described. As the reference data, black reference data and white reference data are acquired in advance.

A subject serving for a black reference is imaged with red light, green light, and blue light, and first black reference data $R_{min}$, second black reference data $G_{min}$, and third black reference data $B_{min}$ are acquired as the black reference data. The first black reference data $R_{min}$, is an output value output from the light-receiving device of each pixel in imaging with red light. The second black reference data $G_{min}$ is an output value output from the light-receiving device of each pixel in imaging with green light. The third black reference data $B_{min}$ is an output value output from the light-receiving device of each pixel in imaging with blue light. As the first black reference data $R_{min}$, the second black reference data $G_{min}$, and the third black reference data Bruin, for example, voltage values can be used. The black subject used to acquire the reference data preferably has an extremely low reflectance.

In a similar manner, a subject serving for a white reference is imaged with red light, green light, and blue light, and first white reference data $R_{max}$, second white reference data $G_{max}$, and third white reference data $B_{max}$ are acquired as the white reference data. The first white reference data $R_{max}$ is an output value output from the light-receiving device of each pixel in imaging with red light. The second white reference data $G_{max}$ is an output value output from the light-receiving device of each pixel in imaging with green light. The third white reference data $B_{max}$ is an output value output from the light-receiving device of each pixel in imaging with blue light. As the first white reference data $R_{max}$, the second white reference data $G_{max}$, and the third white reference data $B_{max}$, for example, voltage values can be used. The white subject used to acquire the reference data preferably has an extremely high reflectance.

The reference data may be acquired at the time of shipping of the imaging device and stored in the memory 73 in advance. For the memory 73, a nonvolatile memory such as a flash memory is preferably used. In addition, the user may be allowed to rewrite the reference data when using the imaging device. The arithmetic circuit 71 has a function of reading out the reference data stored in the memory 73. Specifically, the arithmetic circuit 71 has a function of reading out the reference data from the memory 73 and correcting the image data of each color to the correction image data with the use of the reference data. The correction image data of each color may be output to the memory 73 and retained.

The first black reference data $R_{min}$, the second black reference data $G_{min}$, the third black reference data $B_{min}$, the first white reference data $R_{max}$, the second white reference data $G_{max}$, and the third white reference data $B_{max}$ are preferably acquired for each pixel 60. When the correction is performed on each pixel 60 using the acquired reference data, the correction can be less affected by variations in the characteristics of the light-emitting devices and the light-receiving devices. The average of all values in the imaging unit 61 may be used for the first black reference data $R_{min}$, the second black reference data $G_{min}$, the third black reference data $B_{min}$, the first white reference data $R_{max}$, the second white reference data $G_{max}$, and the third white reference data $B_{max}$. Using the average values as the reference data can reduce the capacitance of the memory 73.

In this specification and the like, the first black reference data $R_{min}$ and the first white reference data $R_{max}$ are referred to as first reference data, the second black reference data $G_{min}$ and the second white reference data $G_{max}$ are referred to as second reference data, and third black reference data $B_{min}$ and third white reference data $B_{max}$ are referred to as reference data in some cases. The first black reference data $R_{min}$, the second black reference data $G_{min}$, the third black reference data $B_{min}$, the first white reference data $R_{max}$, the second white reference data $G_{max}$, and the third white reference data $B_{max}$ are referred to as reference data in some cases.

Calculation of the first correction image data $R_{LSB}$, the second correction image data $G_{LSB}$, and the third correction image data $B_{LSB}$ using the reference data is described.

The first image data $R_X$, the second image data $G_X$, and the third image data $B_X$ output from the light-receiving device are converted into the first correction image data $R_{LSB}$ according to the following formula (1), the second correction image data $G_{LSB}$ according to the following formula (2), and the third correction image data $B_{LSB}$ according to the following formula (3), respectively.

$$R_{LSB}=(R_X-R_{min})/(R_{max}-R_{min})\times A \quad (1)$$

$$G_{LSB}=(G_X-G_{min})/(G_{max}-G_{min})\times A \quad (2)$$

$$B_{LSB}=(B_X-B_{min})/(B_{max}-B_{min})\times A \quad (3)$$

Here, a constant A denotes the maximum gray level possible for a synthesized image SyIM. When the number of bits in the synthesized image SyIM is n, the gray level of the synthesized image SyIM is an integer greater than or equal to 0 and less than or equal to $2^n-1$ and the constant A is $2^n-1$. For example, when the number of bits in the synthesized image SyIM is 8, the gray level of the synthesized image SyIM is an integer greater than or equal to 0 and less than or equal to 255 and the constant A is 255. While the first image data $R_X$, the second image data $G_X$, and the third image data $B_X$ output from the light-receiving device are analog values, the first correction image data $R_{LSB}$, the second correction image data $G_{LSB}$, and the third correction image data $B_{LSB}$ are digital values.

The arithmetic circuit 71 combines the first correction image data $R_{LSB}$, the second correction image data $G_{LSB}$, and the third correction image data $B_{LSB}$ to generate the synthesized image data; thus, the color synthesized image SyIM can be generated.

In this manner, image data of each color is corrected using the white reference data and the black reference data to generate the synthesized image SyIM. The imaging device can thus achieve high color reproducibility.

Although the example in which the reference data acquired by imaging the subject for the white reference and the subject for the black reference is used for the correction, one embodiment of the present invention is not limited thereto. The specific value determined from the characteristics of the light-receiving device may be used as the reference data. Reference data with a temperature as a variable may be employed by acquiring the temperature in the imaging device or the temperature in the usage environment. Using the reference data with a temperature as a variable can reduce the influence of temperature at the time of imaging; accordingly, even when the characteristics of the light-emitting device and the light-receiving device change depending on temperature, the imaging device can achieve high color reproducibility. Reference data with cumulative driving times as variables may be employed by acquiring the cumulative driving time of the light-emitting device and the cumulative driving time of the light-receiving device. With the use of reference data with cumulative operating time as variables, even when the characteristics of the light-emitting device and light-receiving photon change depending on cumulative driving times, the imaging device can achieve high color reproducibility.

<Operation Example of Imaging Device>

Figure 5:
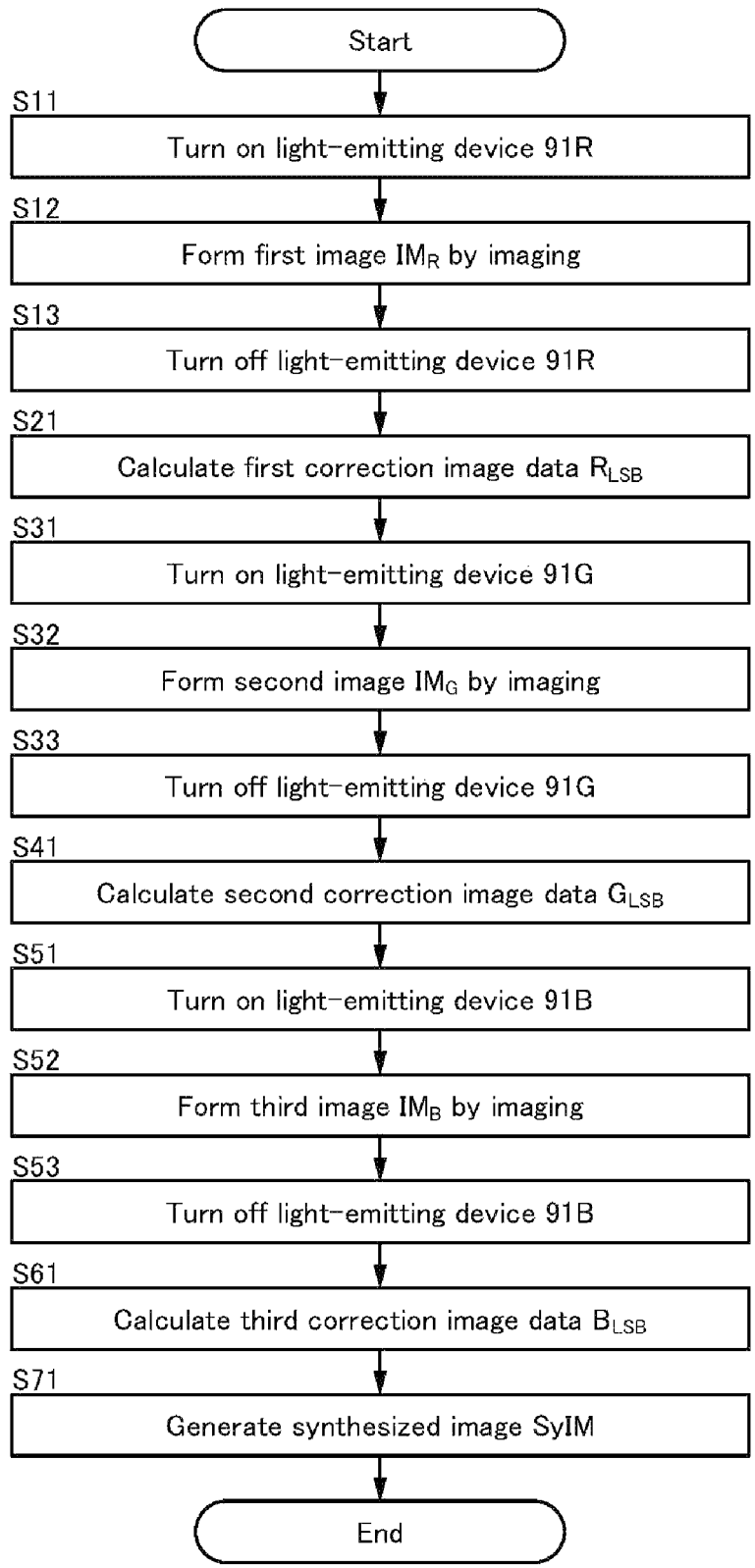
FIG. 5 is a flowchart showing an example of an operation of an imaging device.

An operation of the imaging device of one embodiment of the present invention is described with reference to FIG. 5. FIG. 5 is a flow chart showing an operation of the imaging device.

In Step S11, the light-emitting device 91R that emits red light is turned on. Preferably, all the light-emitting devices 91R included in the imaging unit 61 are turned on in this step.

In Step S12, the first image $IM_R$ is formed by imaging using the light-receiving device 91PD. Since the imaging proceeds while the light-emitting device 91R is emitting light, the red light is reflected by the subject and the reflected light enters the light-receiving device 91PD. This means that the first image $IM_R$ is information on the red color of the subject. In addition, the signal from the light-receiving device 91PD in each pixel (hereinafter, referred to as first image data $R_X$) is output to the arithmetic circuit 71. The first image data $R_X$ is data corresponding to the value of current flowing to the light-receiving device 91PD in each pixel, and output to the arithmetic circuit 71 from the imaging unit 61 through the circuit portion 65. As the first image data $R_X$, a voltage value can be used, for example.

In Step S13, the light-emitting device 91R is turned off. Preferably, all the light-emitting devices 91R included in the imaging unit 61 are turned off.

As Step S21, by the arithmetic circuit 71, the first image data $R_X$ is corrected using the reference data, and the first correction image data $R_{LSB}$ is calculated. The first correction image data $R_{LSB}$ is output to the memory 73 and retained. The reference data, which is retained in the memory 73, is read out to the arithmetic circuit 71 at the time of the correction. As the reference data, the first white reference data $R_{max}$ and the first black reference data $R_{min}$ can be used.

In Step S31, the light-emitting device 91G that emits green light is turned on. Preferably, all the light-emitting devices 91G included in the imaging unit 61 are turned on in this step.

In Step S32, the second image $IM_G$ is formed by imaging using the light-receiving device 91PD. Since the imaging proceeds while the light-emitting device 91G is emitting light, the green light is reflected by the subject and the reflected light enters the light-receiving device 91PD. This means that the second image $IM_G$ is information on the green color of the subject. In addition, the signal from the light-receiving device 91PD in each pixel (hereinafter, referred to as second image data $G_X$) is output to the arithmetic circuit 71. The second image data $G_X$ is data corresponding to the value of current flowing to the light-receiving device 91PD in each pixel, and output to the arithmetic circuit 71 from the imaging unit 61 through the circuit portion 65. As the second image data $G_X$, a voltage value can be used, for example.

In Step S33, the light-emitting device 91G is turned off. Preferably, all the light-emitting devices 91G included in the imaging unit 61 are turned off.

As Step S41, by the arithmetic circuit 71, the second image data $G_X$ is corrected using the reference data, and the second correction image data $G_{LSB}$ is calculated. The second correction image data $G_{LSB}$ is output to the memory 73 and retained. As the reference data, the second white reference data $G_{max}$ and the second black reference data $G_{min}$ can be used.

In Step S51, the light-emitting device 91B that emits blue light is turned on. Preferably, all the light-emitting devices 91B included in the imaging unit 61 are turned on in this step.

In Step S52, the third image $IM_B$ is formed by imaging using the light-receiving device 91PD. Since the imaging proceeds while the light-emitting device 91B is emitting light, the blue light is reflected by the subject and the reflected light enters the light-receiving device 91PD. This means that the third image $IM_B$ is information on the blue color of the subject. In addition, the signal from the light-receiving device 91PD in each pixel (hereinafter, referred to as third image data $B_X$) is output to the arithmetic circuit 71. The third image data $B_X$ is data corresponding to the value of current flowing to the light-receiving device 91PD in each pixel, and output to the arithmetic circuit 71 from the imaging unit 61 through the circuit portion 65. As the third image data $B_X$, a voltage value can be used, for example.

In Step S53, the light-emitting device 91B is turned off. Preferably, all the light-emitting devices 91B included in the imaging unit 61 are turned off.

As Step S61, by the arithmetic circuit 71, the third image data $B_X$ is corrected using the reference data, and the third correction image data $B_{LSB}$ is calculated. The third correction image data $B_{LSB}$ is output to the memory 73 and retained. As the reference data, the third white reference data $B_{max}$ and the third black reference data $B_{min}$ can be used.

As Step S71, from the memory 73, the first correction image data $R_{LSB}$, the second correction image data $G_{LSB}$, and the third correction image data $B_{LSB}$ are read out to the arithmetic circuit 71, and combined to generate the synthesized image data; thus, the color synthesized image SyIM can be generated.

In this manner, image data of each color is corrected using the white reference data and the black reference data. The imaging device can thus achieve high color reproducibility.

Although FIG. 5 shows an example in which imaging is performed in the order of red, green, and blue, there is no particular limitation on the kinds of colors, the number of colors, and the order of colors for imaging.

Structure Example 2 of Imaging Device

Detailed structures of the imaging device of one embodiment of the present invention are described with reference to FIG. 6 to FIG. 10.

[Imaging Device 10A]

Figure 6A:
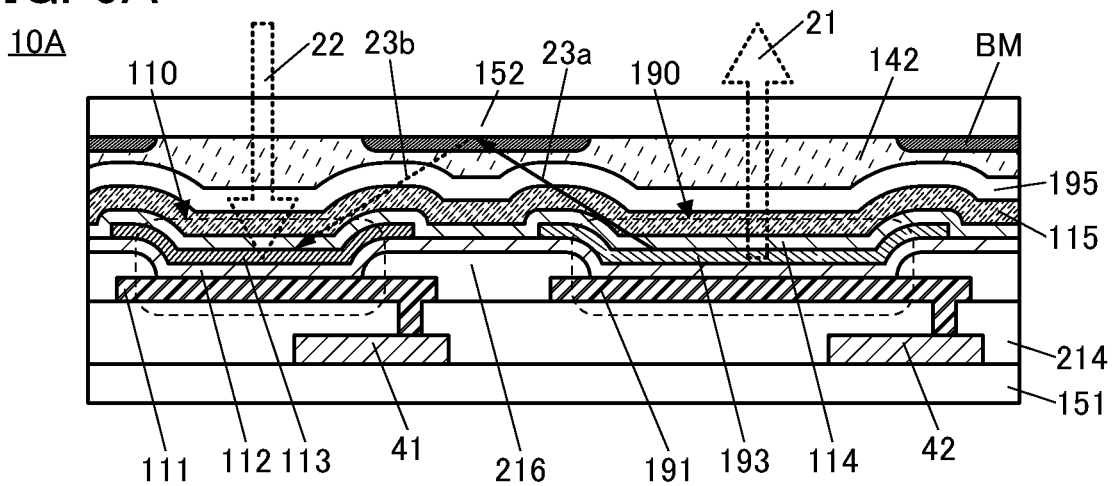
FIG. 6A to FIG. 6C are cross-sectional views each showing an example of an imaging device.

FIG. 6A shows a cross-sectional view of an imaging device 10A.

The imaging device 10A includes a light-receiving device 110 and a light-emitting device 190.

The light-receiving device 110 includes a pixel electrode 111, a common layer 112, an active layer 113, a common layer 114, and a common electrode 115.

The light-emitting device 190 includes a pixel electrode 191, the common layer 112, a light-emitting layer 193, the common layer 114, and the common electrode 115.

The pixel electrode 111, the pixel electrode 191, the common layer 112, the active layer 113, the light-emitting layer 193, the common layer 114, and the common electrode 115 may each have a single-layer structure or a stacked-layer structure.

The pixel electrode 111 and the pixel electrode 191 are positioned over an insulating layer 214. The pixel electrode 111 and the pixel electrode 191 can be formed using the same material in the same step.

The common layer 112 is positioned over the pixel electrode 111 and the pixel electrode 191. The common layer 112 is shared by the light-receiving device 110 and the light-emitting device 190.

The active layer 113 overlaps with the pixel electrode 111 with the common layer 112 therebetween. The light-emitting layer 193 overlaps with the pixel electrode 191 with the common layer 112 therebetween. The active layer 113 contains a first organic compound, and the light-emitting layer 193 contains a second organic compound that is different from the first organic compound.

The common layer 114 is positioned over the common layer 112, the active layer 113, and the light-emitting layer 193. The common layer 114 is shared by the light-receiving device 110 and the light-emitting device 190.

The common electrode 115 includes a portion overlapping with the pixel electrode 111 with the common layer 112, the active layer 113, and the common layer 114 therebetween. The common electrode 115 further includes a portion overlapping with the pixel electrode 191 with the common layer 112, the light-emitting layer 193, and the common layer 114 therebetween. The common electrode 115 is shared by the light-receiving device 110 and the light-emitting device 190.

In the imaging device of this embodiment, an organic compound is used for the active layer 113 of the light-receiving device 110. The light-receiving device 110 can have such a structure that the layers other than the active layer 113 are shared with the light-emitting device 190 (the EL element). Therefore, the light-receiving device 110 can be formed concurrently with the formation of the light-emitting device 190 only by adding a step of depositing the active layer 113 in the manufacturing process of the light-emitting device 190. The light-emitting device 190 and the light-receiving device 110 can be formed over one substrate. Accordingly, the light-emitting device 190 and the light-receiving device 110 can be incorporated into the imaging device without a significant increase in the number of manufacturing steps.

The imaging device 10A shows an example in which the light-receiving device 110 and the light-emitting device 190 have a common structure except that the active layer 113 of the light-receiving device 110 and the light-emitting layer 193 of the light-emitting device 190 are separately formed. Note that the structures of the light-receiving device 110 and the light-emitting device 190 are not limited thereto. The light-receiving device 110 and the light-emitting device 190 may include separately formed layers other than the active layer 113 and the light-emitting layer 193 (see imaging devices 10K, 10L, and 10M described later). The light-receiving device 110 and the light-emitting device 190 preferably include at least one layer used in common (common layer). Thus, the light-emitting device 190 and the light-receiving device 110 can be incorporated into the imaging device without a significant increase in the number of manufacturing steps.

The imaging device 10A includes the light-receiving device 110, the light-emitting device 190, a transistor 41, a transistor 42, and the like between a pair of substrates (a substrate 151 and a substrate 152).

In the light-receiving device 110, the common layer 112, the active layer 113, and the common layer 114, which are positioned between the pixel electrode 111 and the common electrode 115, can each be referred to as an organic layer (a layer containing an organic compound). The pixel electrode 111 preferably has a function of reflecting visible light. An end portion of the pixel electrode 111 is covered with a bank 216. The common electrode 115 has a function of transmitting visible light.

The light-receiving device 110 has a function of sensing light. Specifically, the light-receiving device 110 is a photoelectric conversion device that receives light 22 incident from the outside of the imaging device 10A and converts the light 22 into an electric signal. The light 22 can also be expressed as light that is emitted by the light-emitting device 190 and then reflected by an object. The light 22 may enter the light-receiving device 110 through a lens described later. The description in this embodiment is made so that the pixel electrode 111 functions as an anode and the common electrode 115 functions as a cathode to match the electrodes of the light-emitting device 190. In other words, the light-receiving device 110 is driven by application of reverse bias between the pixel electrode 111 and the common electrode 115, so that light incident on the light-receiving device 110 can be sensed and electric charge can be generated.

A light-blocking layer BM is provided on a surface of the substrate 152 facing the substrate 151. The light-blocking layer BM has an opening at a position overlapping with the light-receiving device 110 and an opening at a position overlapping with the light-emitting device 190. Providing the light-blocking layer BM can control the range where the light-receiving device 110 senses light.

For the light-blocking layer BM, a material that blocks light emitted from the light-emitting device can be used. The light-blocking layer BM preferably absorbs visible light. As the light-blocking layer BM, a black matrix can be formed using a metal material or a resin material containing pigment (e.g., carbon black) or dye, for example. The light-blocking layer BM may have a stacked-layer structure of a red color filter, a green color filter, and a blue color filter.

Here, the light-receiving device 110 senses light that is emitted by the light-emitting device 190 and then reflected by an object. However, in some cases, light emitted from the light-emitting device 190 is reflected inside the imaging device 10A and enters the light-receiving device 110 without via an object, in some cases. The light-blocking layer BM can reduce the influence of such stray light. For example, in the case where the light-blocking layer BM is not provided, light 23a emitted from the light-emitting device 190 is reflected by the substrate 152 and reflected light 23b is incident on the light-receiving device 110 in some cases. Providing the light-blocking layer BM can inhibit entry of the reflected light 23b into the light-receiving device 110. Consequently, noise can be reduced, and the sensitivity of a sensor using the light-receiving device 110 can be increased.

In the light-emitting device 190, the common layer 112, the light-emitting layer 193, and the common layer 114, which are positioned between the pixel electrode 191 and the common electrode 115, can each be referred to as an EL layer. The pixel electrode 191 preferably has a function of reflecting visible light. An end portion of the pixel electrode 191 is covered with the bank 216. The pixel electrode 111 and the pixel electrode 191 are electrically insulated from each other by the bank 216. The common electrode 115 has a function of transmitting visible light.

The light-emitting device 190 has a function of emitting visible light. Specifically, the light-emitting device 190 is an electroluminescent element that emits light (see light emission 21) to the substrate 152 side by applying voltage between the pixel electrode 191 and the common electrode 115.

It is preferable that the light-emitting layer 193 be formed not to overlap with a light-receiving region of the light-receiving device 110. Accordingly, it is possible to inhibit the light-emitting layer 193 from absorbing the light 22, so that the amount of light with which the light-receiving device 110 is irradiated can be increased.

The pixel electrode 111 is electrically connected to a source or a drain of the transistor 41 through an opening provided in the insulating layer 214. The end portion of the pixel electrode 111 is covered with the bank 216.

The pixel electrode 191 is electrically connected to a source or a drain of the transistor 42 through an opening provided in the insulating layer 214. The end portion of the pixel electrode 191 is covered with the bank 216. The transistor 42 has a function of controlling the driving of the light-emitting device 190.

The transistor 41 and the transistor 42 are on and in contact with the same layer (the substrate 151 in FIG. 6A).

At least part of a circuit electrically connected to the light-receiving device 110 is preferably formed using the same material in the same steps as a circuit electrically connected to the light-emitting device 190. In that case, the thickness of the imaging device can be smaller than that in the case where the two circuits are formed on different planes, and the manufacturing steps can be simplified.

The light-receiving device 110 and the light-emitting device 190 are preferably covered with a protective layer 195. In FIG. 6A, the protective layer 195 is provided on and in contact with the common electrode 115. Providing the protective layer 195 can inhibit entry of impurities such as water into the light-receiving device 110 and the light-emitting device 190, so that the reliability of the light-receiving device 110 and the light-emitting device 190 can be increased. The protective layer 195 and the substrate 152 are attached to each other with an adhesive layer 142.

Figure 7A:
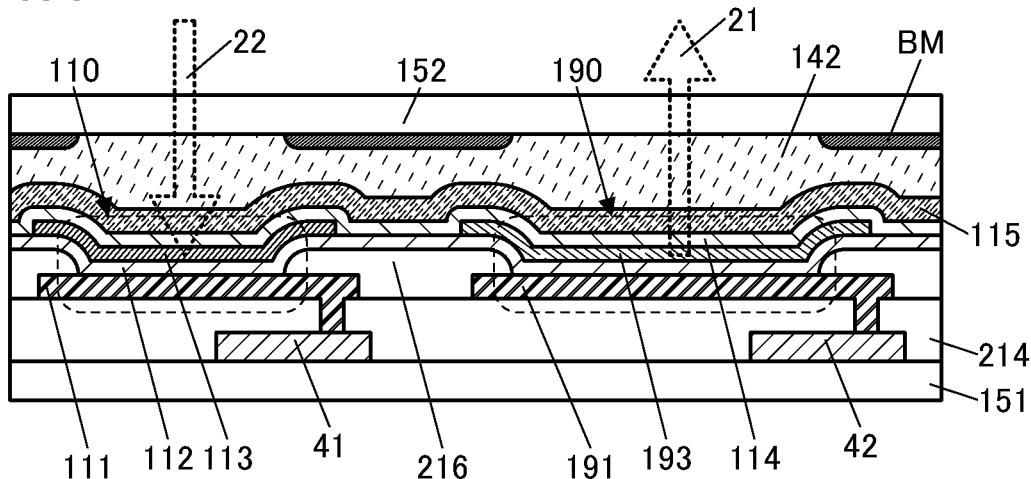
FIG. 7A to FIG. 7C are cross-sectional views each showing an example of an imaging device.

Note that as shown in FIG. 7A, the protective layer is not necessarily provided over the light-receiving device 110 and the light-emitting device 190. In FIG. 7A, the common electrode 115 and the substrate 152 are attached to each other with the adhesive layer 142.

[Imaging Device 10B]

Figure 6B:
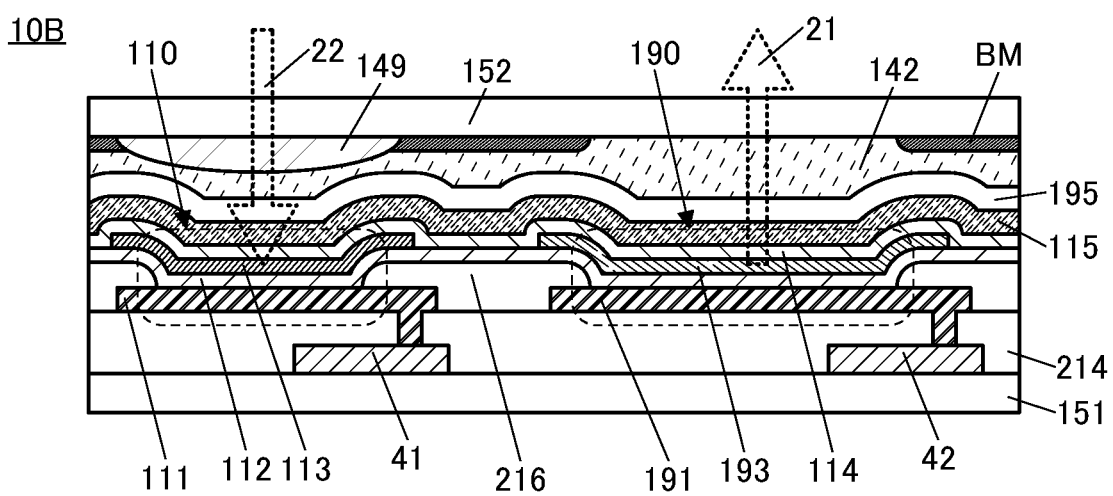

FIG. 6B shows a cross-sectional view of an imaging device 10B that has a structure different from that of the above imaging device 10A. In the description of the imaging device below, components similar to those of the above-mentioned imaging device are not described in some cases.

The imaging device 10B illustrated in FIG. 6B includes a lens 149 in addition to the components of the imaging device 10A.

The imaging device of this embodiment may include the lens 149. The lens 149 is provided at a position overlapping with the light-receiving device 110. In the imaging device 10B, the lens 149 is provided in contact with the substrate 152. The lens 149 included in the imaging device 10B has a convex surface facing the substrate 151. Alternatively, the lens 149 may have a convex surface facing the substrate 152.

In the case where the light-blocking layer BM and the lens 149 are formed on the same plane of the substrate 152, their formation order is not limited. FIG. 6B shows an example in which the lens 149 is formed first; alternatively, the light-blocking layer BM may be formed first. In FIG. 6B, an end portion of the lens 149 is covered with the light-blocking layer BM.

In the imaging device 10B, the light 22 is incident on the light-receiving device 110 through the lens 149. With the lens 149, the imaging range of the light-receiving device 110 can be narrowed as compared to the case where the lens 149 is not provided, thereby inhibiting overlap of the imaging ranges between the adjacent light-receiving devices 110. Thus, a clear image with little blurring can be captured. Given that the imaging range of the light-receiving device 110 does not change, the lens 149 allows the size of a pinhole (corresponding to the size of an opening in BM that overlaps with the light-receiving device 110 in FIG. 6B) to be increased, compared to the case where the lens 149 is not provided. Hence, providing the lens 149 can increase the amount of light entering the light-receiving device 110.

Figure 7B:
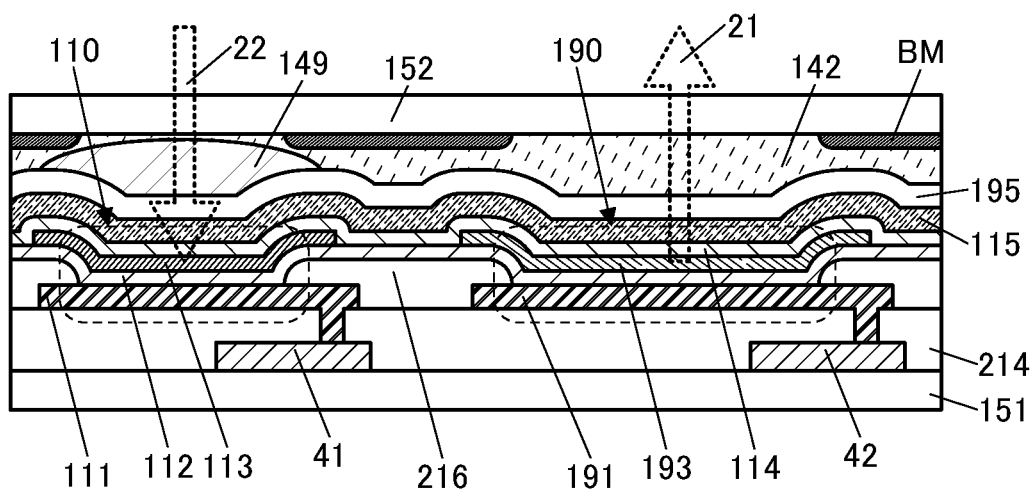
Figure 7C:
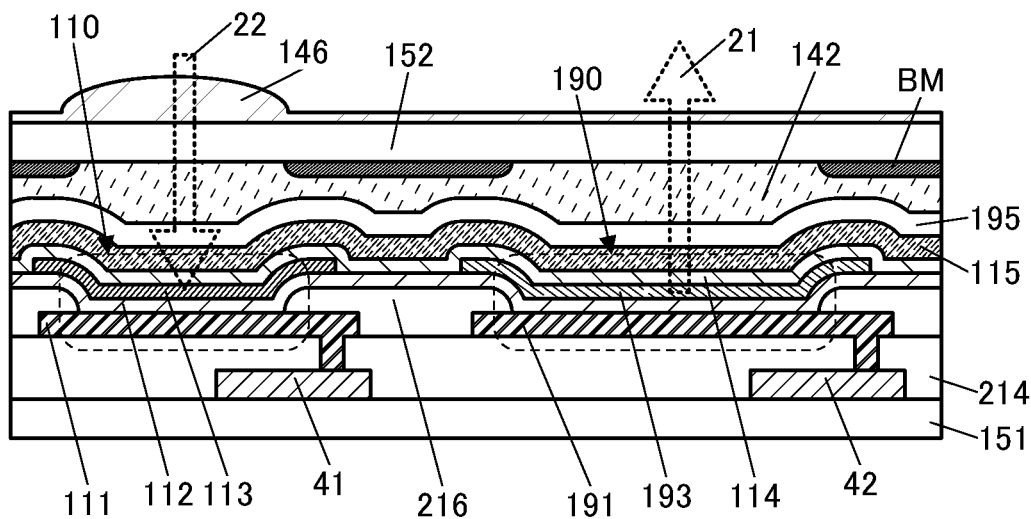

Each of imaging devices illustrated in FIG. 7B and FIG. 7C has a structure in which the light 22 enters the light-receiving device 110 through the lens 149, in a manner similar to that of the imaging device 10B illustrated in FIG. 6B.

In FIG. 7B, the lens 149 is provided in contact with a top surface of the protective layer 195. The lens 149 included in the imaging device illustrated in FIG. 7B has a convex surface facing the substrate 152.

In the imaging device illustrated in FIG. 7C, a lens array 146 is provided on the imaging surface side of the substrate 152. A lens included in the lens array 146 is provided at a position overlapping with the light-receiving device 110. The light-blocking layer BM is preferably provided on a surface of the substrate 152 facing the substrate 151.

As a method for forming the lens used in the imaging device of this embodiment, a lens such as a microlens may be formed directly over the substrate or the light-receiving device, or a lens array formed separately, such as a microlens array, may be attached to the substrate.

[Imaging Device 10C]

Figure 6C:
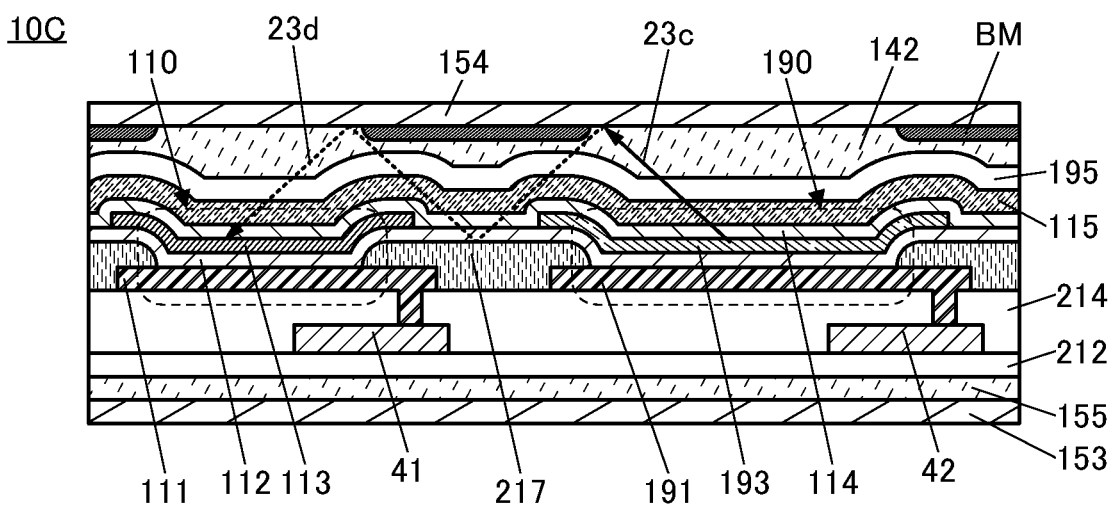

FIG. 6C shows a cross section of an imaging device 10C.

The imaging device 10C illustrated in FIG. 6C differs from the imaging device 10A in that the substrate 151, the substrate 152, and the bank 216 are not included but a substrate 153, a substrate 154, an adhesive layer 155, an insulating layer 212, and a bank 217 are included.

The substrate 153 and the insulating layer 212 are attached to each other with the adhesive layer 155. The substrate 154 and the protective layer 195 are attached to each other with the adhesive layer 142.

The imaging device 10C is formed in such a manner that the insulating layer 212, the transistor 41, the transistor 42, the light-receiving device 110, the light-emitting device 190, and the like, which are formed over a formation substrate, are transferred onto the substrate 153. The substrate 153 and the substrate 154 are preferably flexible. Accordingly, the flexibility of the imaging device 10C can be increased. For example, a resin is preferably used for each of the substrate 153 and the substrate 154.

For each of the substrate 153 and the substrate 154, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. Glass that is thin enough to have flexibility may be used for one or both of the substrate 153 and the substrate 154.

As the substrate included in the imaging device of this embodiment, a film having high optical isotropy may be used. Examples of a highly optically isotropic film include a triacetyl cellulose (TAC, also referred to as cellulose triacetate) film, a cycloolefin polymer (COP) film, a cycloolefin copolymer (COC) film, and an acrylic film.

The bank 217 preferably absorbs light emitted from the light-emitting device. As the bank 217, a black matrix can be formed using a resin material containing a pigment or dye, for example. Moreover, the bank 217 can be formed of a colored insulating layer by using a brown resist material.

In some cases, light 23c emitted from the light-emitting device 190 is reflected by the substrate 154 and the bank 217 and reflected light 23d is incident on the light-receiving device 110, in some cases. In other cases, the light 23c passes through the bank 217 and is reflected by a transistor, a wiring, or the like, and thus reflected light is incident on the light-receiving device 110 in some cases. When the bank 217 absorbs the light 23c, the reflected light 23d can be inhibited from being incident on the light-receiving device 110. Consequently, noise can be reduced, and the sensitivity of a sensor using the light-receiving device 110 can be increased.

The bank 217 preferably absorbs at least light having a wavelength that is sensed by the light-receiving device 110. For example, in the case where the light-receiving device 110 senses green light emitted from the light-emitting device 190, the bank 217 preferably absorbs at least green light. For example, when the bank 217 includes a red color filter, the bank 217 can absorb the green light 23c and thus the reflected light 23d can be inhibited from being incident on the light-receiving device 110.

[Imaging Device 10D]

Figure 8A:
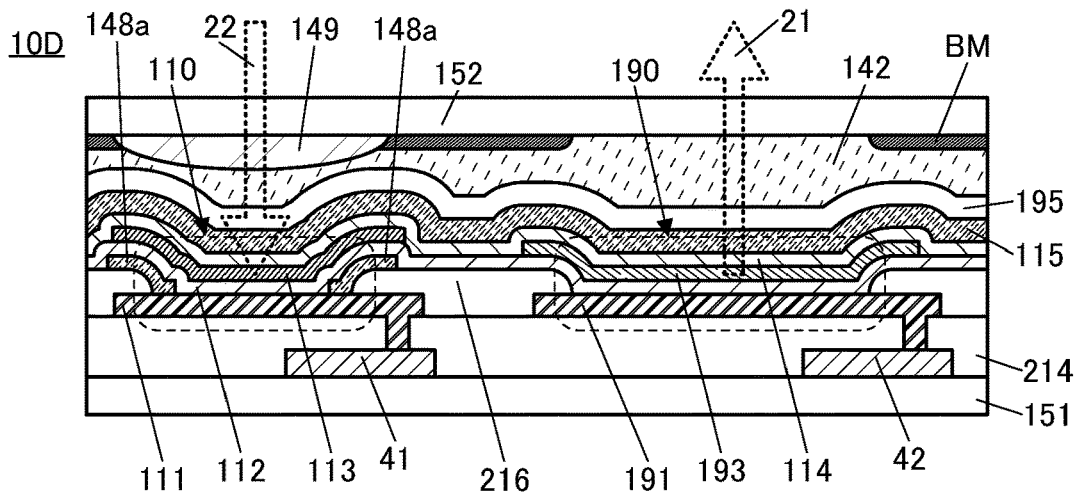
FIG. 8A to FIG. 8C are cross-sectional views each showing an example of an imaging device.

FIG. 8A shows a cross section of an imaging device 10D.

The imaging device 10D includes a colored layer 148a in addition to the components of the display unit 10B.

The colored layer 148a includes a portion in contact with a top surface of the pixel electrode 111 in the light-receiving device 110 and a portion in contact with a side surface of the bank 216.

The colored layer 148a preferably absorbs light emitted by the light-emitting device. As the colored layer 148a, a black matrix can be formed using a resin material containing a pigment or dye, for example. Moreover, the colored layer 148a can be formed of a colored insulating layer by using a brown resist material.

The colored layer 148a preferably absorbs at least light having a wavelength that is sensed by the light-receiving device 110. For example, in the case where the light-receiving device 110 senses green light emitted from the light-emitting device 190, the colored layer 148a preferably absorbs at least green light. For example, when including a red color filter, the colored layer 148a can absorb green light, and thus stray light (reflected light) can be inhibited from entering the light-receiving device 110.

When the colored layer 148a absorbs stray light generated in the imaging device 10D, the amount of stray light entering the light-receiving device 110 can be reduced. Consequently, noise can be reduced, and the sensitivity of a sensor using the light-receiving device 110 can be increased.

In the imaging device of this embodiment, the colored layer is provided between the light-receiving device 110 and the light-emitting device 190. This can inhibit stray light from entering the light-receiving device 110 from the light-emitting device 190.

[Imaging Device 10E]

Figure 8B:
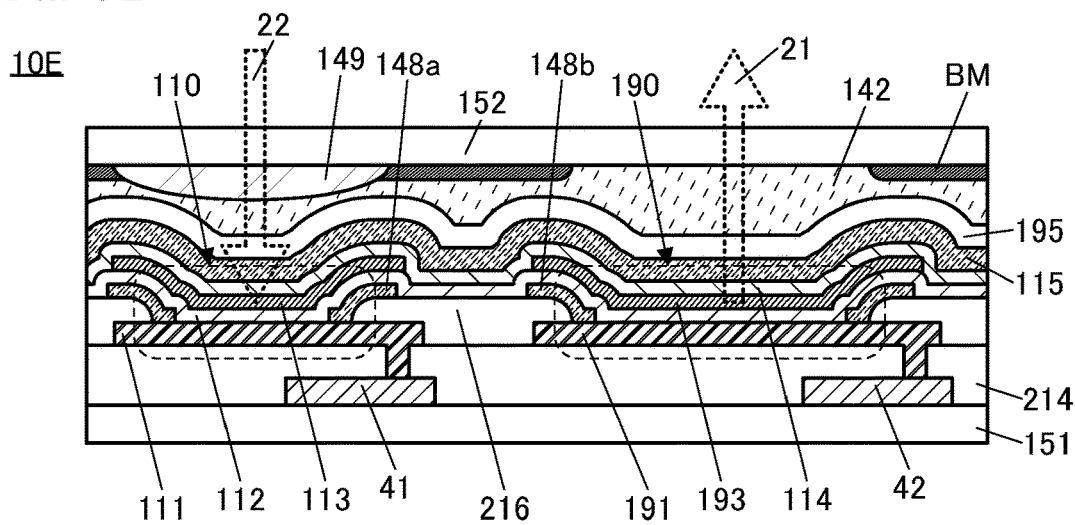

FIG. 8B shows a cross section of an imaging device 10E.

The imaging device 10E includes a colored layer 148b in addition to the components of the imaging device 10D. A material that can be used for the colored layer 148b is the same as that used for the colored layer 148a.

The colored layer 148b includes a portion in contact with a top surface of the pixel electrode 191 in the light-emitting device 190 and a portion in contact with a side surface of the bank 216.

The imaging device of this embodiment preferably includes one or both of the colored layer 148a and the colored layer 148b.

With both the colored layer 148a and the colored layer 148b, the amount of stray light entering the light-receiving device 110 can be further reduced.

Note that in the imaging device 10E, the colored layer 148b is in contact with a top surface of the pixel electrode 191; thus, the amount of light 21 that is emitted from the light-emitting device 190 and extracted to the outside of the imaging device 10E is smaller than that in the case of the imaging device 10D (FIG. 8A) in some cases. Therefore, in the case where only one of the colored layer 148a and the colored layer 148b is provided, only the colored layer 148a is preferably provided on the light-receiving device 110 side as in the imaging device 10D. This can increase the light extraction efficiency of the light-emitting device 190 and inhibits entry of stray light into the light-receiving device 110. Thus, the imaging device can form a high-quality image by imaging.

[Imaging Device 10F]

Figure 8C:
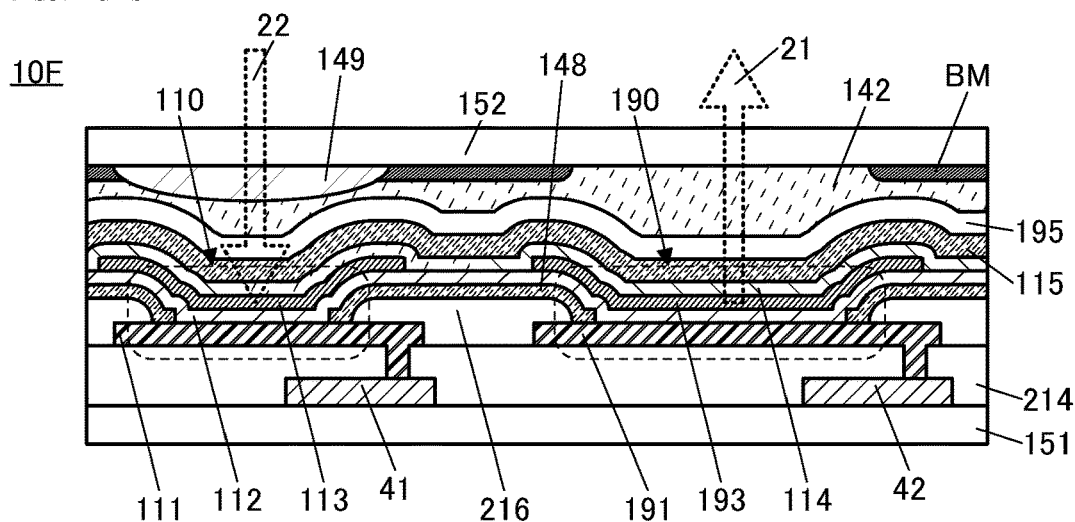

FIG. 8C shows a cross section of an imaging device 10F.

The imaging device 10F includes a colored layer 148 in addition to the components of the imaging device 10B. A material that can be used for the colored layer 148 is the same as that used for the colored layer 148a.

The colored layer 148 is provided to cover a top surface and a side surface of the bank 216. The colored layer 148 includes a portion in contact with a top surface of the pixel electrode 111 in the light-emitting device 110 and a portion in contact with a top surface of the pixel electrode 191 in the light-emitting device 190.

It is not necessary that the colored layer 148a and the colored layer 148b shown in FIG. 8B are isolated from each other, and they may be one film as the colored layer 148 as shown in FIG. 8C. When the colored layer 148 absorbs stray light generated in the imaging device 10F, the amount of stray light entering the light-receiving device 110 can be reduced. Consequently, noise can be reduced, and the sensitivity of a sensor using the light-receiving device 110 can be increased.

[Imaging Device 10G]

Figure 9A:
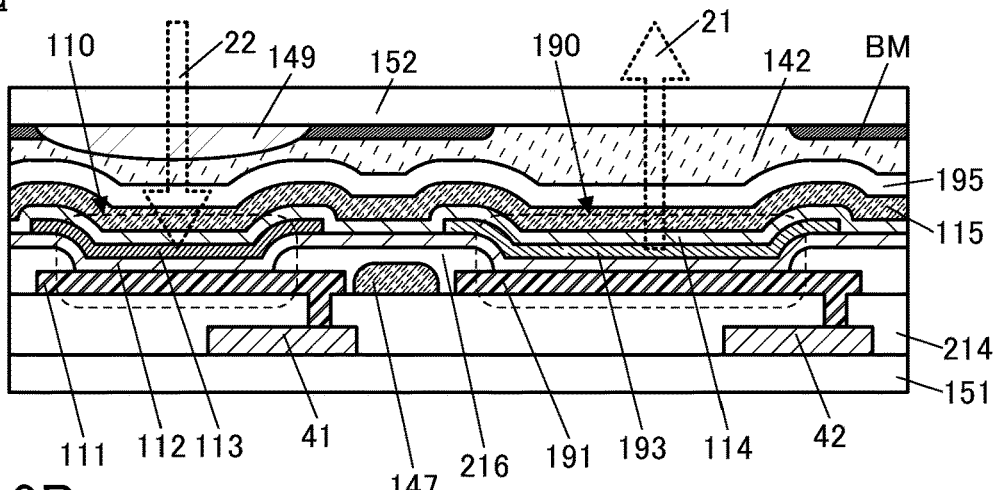
FIG. 9A to FIG. 9C are cross-sectional views each showing an example of an imaging device.

FIG. 9A shows a cross section of an imaging device 10G.

The imaging device 10G includes a colored layer 147 in addition to the components of the imaging device 10B.

The colored layer 147 is positioned over the insulating layer 214, and the bank 216 covers a top surface and a side surface of the colored layer 147. The colored layer 147 and the light-receiving device 110 are electrically isolated from each other with the bank 216. In a similar manner, the colored layer 147 and the light-emitting device 190 are electrically isolated from each other with the bank 216.

A material that can be used for the colored layer 147 is the same as that used for the colored layer 148a. As in the above-described cases of the colored layers 148, 148a, and 148b, the colored layer 147 absorbs stray light generated in the imaging device 10G, whereby the amount of stray light entering the light-receiving device 110 can be reduced. Consequently, noise can be reduced, and the sensitivity of a sensor using the light-receiving device 110 can be increased.

The above-described colored layers 148, 148a, and 148b may have lower resistivity than the bank 216, depending on materials thereof, because the colored layers are formed to absorb light. For example, the resistivity of a resin containing a pigment such as carbon is lower than that of a resin not containing the pigment. Thus, when any of the colored layers 148, 148a, and 148b is provided, current leakage may occur in an adjacent light-emitting device or light-emitting device. For example, current leaking to an adjacent light-emitting device causes a problem in that an undesired light-emitting device emits light (the problem is also referred to as cross-talk).

Meanwhile, the colored layer 147 is provided apart from each of the light-receiving device 110 and the light-emitting device 190. The colored layer 147 is electrically isolated from each of the light-receiving device 110 and the light-emitting device 190 with the bank 216. Thus, even when the colored layer 147 has low resistivity, the light-emitting device 110 and the light-emitting device 190 are less likely to be affected by the colored layer, which is preferable because the range of choices for materials used in the colored layer 147 is widened. A black matrix may be formed using a metal material or the like, for example, as the colored layer 147.

[Imaging Device 10H]

Figure 9B:
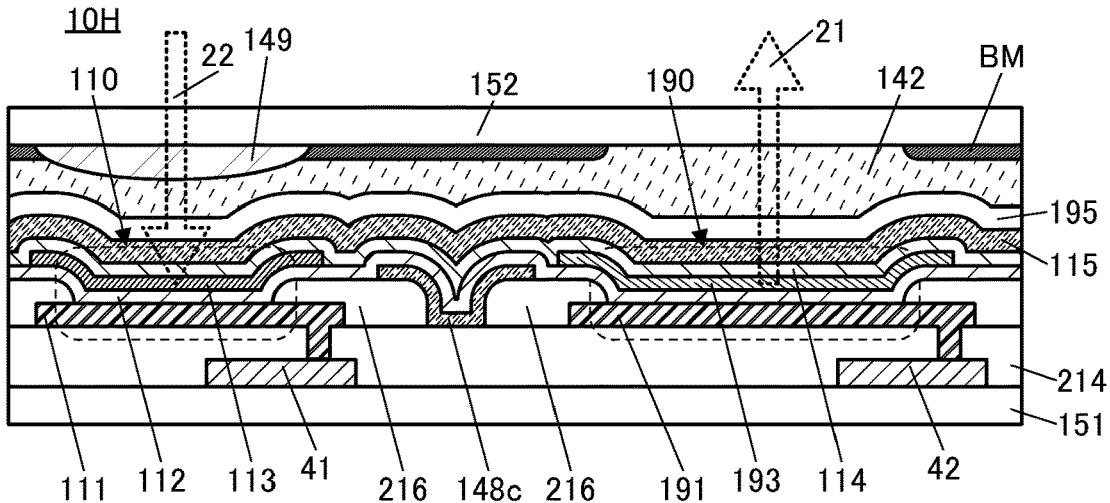

FIG. 9B shows a cross section of an imaging device 10H.

The imaging device 10H includes a colored layer 148c in addition to the components of the imaging device 10B.

In the imaging device 10H, the bank 216 has an opening reaching the insulating layer 214. The colored layer 148c includes a portion in contact with the insulating layer 214 through the opening, a portion in contact with a side surface of the bank 216 inside the opening, and a portion in contact with a top surface of the bank 216. The colored layer 148c and the light-receiving device 110 are electrically isolated from each other with the bank 216. In a similar manner, the colored layer 148c and the light-emitting device 190 are electrically isolated from each other with the bank 216.

A material that can be used for the colored layer 148c is the same as that of the colored layer 147. When the colored layer 148c absorbs stray light generated in the imaging device 10H, the amount of stray light entering the light-receiving device 110 can be reduced. Consequently, noise can be reduced, and the sensitivity of a sensor using the light-receiving device 110 can be increased.

The colored layer 148c is provided apart from each of the light-receiving device 110 and the light-emitting device 190. In addition, the colored layer 148c is electrically isolated from each of the light-receiving device 110 and the light-emitting device 190 with the bank 216. Thus, even when the colored layer 148c has low resistivity, the light-emitting device 110 and the light-emitting device 190 are less likely to be affected by the colored layer, which is preferable because the range of choices for materials used for the colored layer 148c is widened.

[Imaging Device 10J]

Figure 9C:
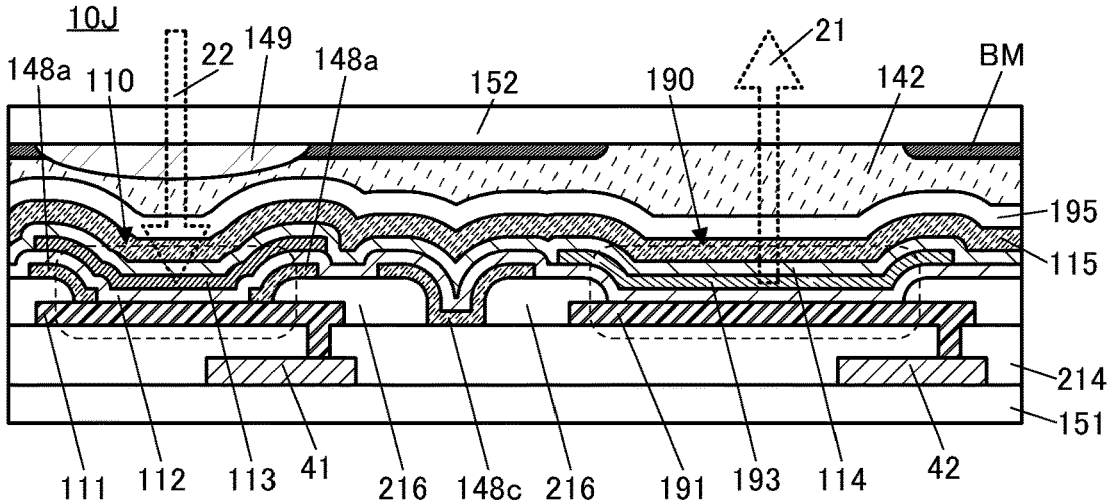

FIG. 9C shows a cross section of an imaging device 10J.

The imaging device 10J includes a colored layer 148c in addition to the components of the imaging device 10D.

As illustrated in FIG. 8A to FIG. 8C and FIG. 9A to FIG. 9C, the imaging device of one embodiment of the present invention preferably includes one or more of the colored layers 148, 148a, 148b, 148c, and 147. This enables absorption of stray light generated in the imaging device and reduction of the amount of stray light entering the light-receiving device 110. Consequently, noise can be reduced, and the sensitivity of a sensor using the light-receiving device 110 can be increased.

[Imaging Devices 10K, 10L, 10M]

Figure 10A:
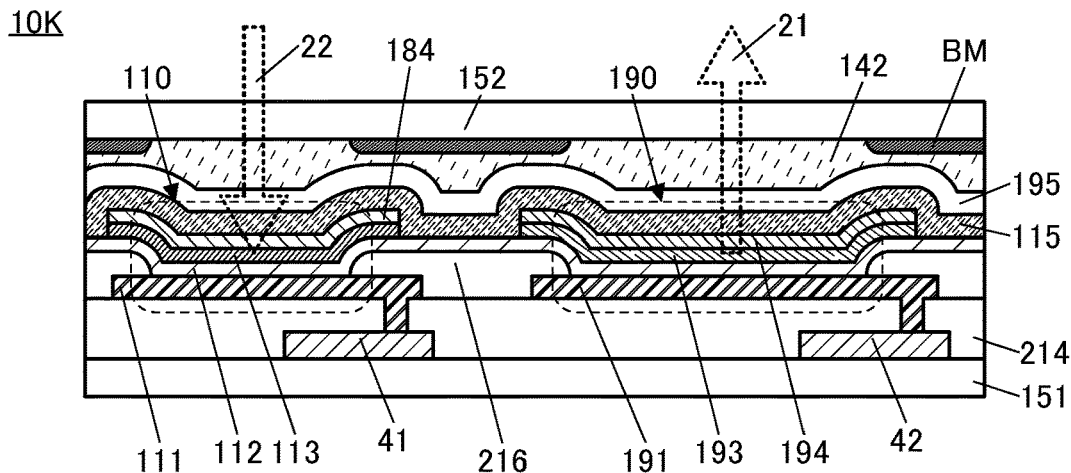
FIG. 10A to FIG. 10C are cross-sectional views each showing an example of an imaging device.
Figure 10B:
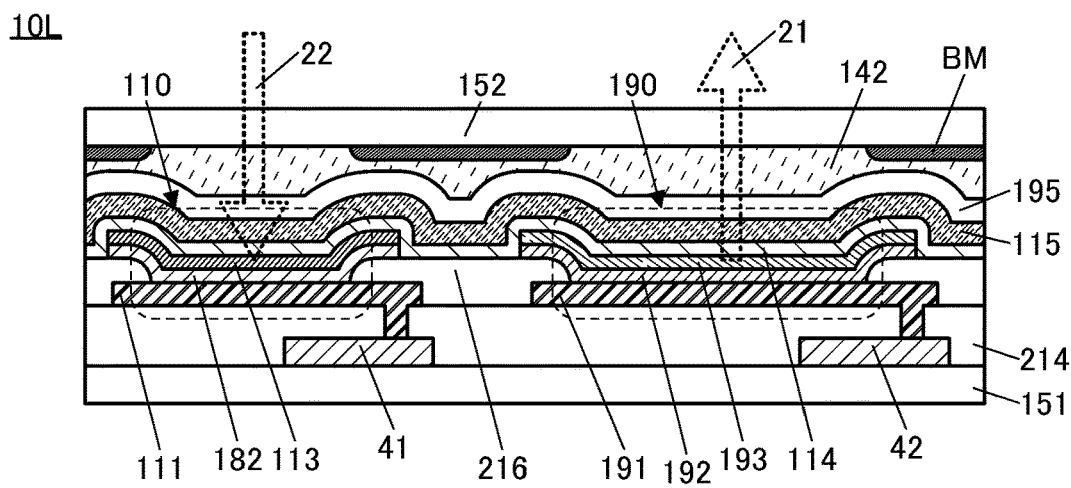
Figure 10C:
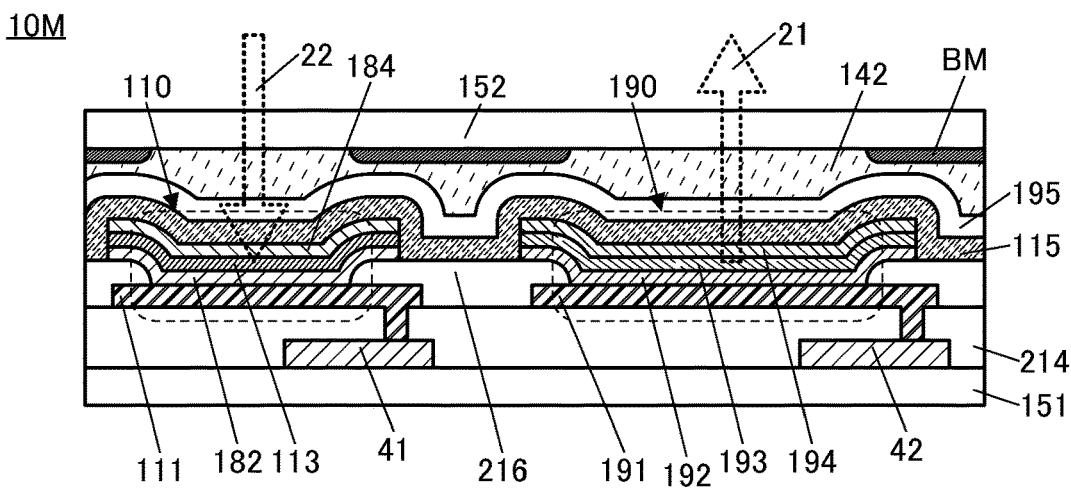

FIG. 10A shows a cross section of an imaging device 10K, FIG. 10B shows a cross section of an imaging device 10L, and FIG. 10C shows a cross section of an imaging device 10M.

The imaging device 10K differs from the imaging device 10A in that the common layer 114 is not included and a buffer layer 184 and a buffer layer 194 are included. The buffer layer 184 and the buffer layer 194 may each have a single-layer structure or a stacked-layer structure.

In the imaging device 10K, the light-receiving device 110 includes the pixel electrode 111, the common layer 112, the active layer 113, the buffer layer 184, and the common electrode 115. In the imaging device 10K, the light-emitting device 190 includes the pixel electrode 191, the common layer 112, the light-emitting layer 193, the buffer layer 194, and the common electrode 115.

The imaging device 10L differs from the imaging device 10A in that the common layer 112 is not included and a buffer layer 182 and a buffer layer 192 are included. The buffer layer 182 and the buffer layer 192 may each have a single-layer structure or a stacked-layer structure.

In the imaging device 10L, the light-receiving device 110 includes the pixel electrode 111, the buffer layer 182, the active layer 113, the common layer 114, and the common electrode 115. In the imaging device 10L, the light-emitting device 190 includes the pixel electrode 191, the buffer layer 192, the light-emitting layer 193, the common layer 114, and the common electrode 115.

The imaging device 10M differs from the imaging device 10A in that the common layer 112 and the common layer 114 are not included and the buffer layers 182, 184, 192, and 194 are included.

In the imaging device 10M, the light-receiving device 110 includes the pixel electrode 111, the buffer layer 182, the active layer 113, the buffer layer 184, and the common electrode 115. In the imaging device 10M, the light-emitting device 190 includes the pixel electrode 191, the buffer layer 192, the light-emitting layer 193, the buffer layer 194, and the common electrode 115.

Other layers as well as the active layer 113 and the light-emitting layer 193 can be formed separately when the light-receiving device 110 and the light-emitting device 190 are manufactured.

The imaging device 10K shows an example in which the buffer layer 184 between the common electrode 115 and the active layer 113 and the buffer layer 194 between the common electrode 115 and the light-emitting layer 193 are formed separately. As the buffer layer 184, for example, an electron-transport layer can be formed. As the buffer layer 194, one or both of an electron-injection layer and an electron-transport layer can be formed, for example.

The imaging device 10L shows an example in which the buffer layer 182 between the pixel electrode 111 and the active layer 113 and the buffer layer 192 between the pixel electrode 191 and the light-emitting layer 193 are formed separately. As the buffer layer 182, for example, a hole-transport layer can be formed. As the buffer layer 192, one or both of a hole-injection layer and a hole-transport layer can be formed, for example.

The imaging device 10M shows an example in which in each of the light-receiving device 110 and the light-emitting device 190, a common layer is not provided between the pair of electrodes (the pixel electrode 111 or 191 and the common electrode 115). The light-receiving device 110 and the light-emitting device 190 included in the imaging device 10M can be manufactured in the following manner: the pixel electrode 111 and the pixel electrode 191 are formed over the insulating layer 214 using the same material in the same step; the buffer layer 182, the active layer 113, and the buffer layer 184 are formed over the pixel electrode 111; the buffer layer 192, the light-emitting layer 193, and the buffer layer 194 are formed over the pixel electrode 191; and then, the common electrode 115 is formed to cover the pixel electrode 111, the buffer layer 182, the active layer 113, the buffer layer 184, the pixel electrode 191, the buffer layer 192, the light-emitting layer 193, and the buffer layer 194. Note that the manufacturing order of the stacked-layer structure of the buffer layer 182, the active layer 113, and the buffer layer 184 and the stacked-layer structure of the buffer layer 192, the light-emitting layer 193, and the buffer layer 194 is not particularly limited. For example, after the buffer layer 182, the active layer 113, and the buffer layer 184 are formed, the buffer layer 192, the light-emitting layer 193, and the buffer layer 194 may be formed. By contrast, the buffer layer 192, the light-emitting layer 193, and the buffer layer 194 may be formed before the buffer layer 182, the active layer 113, and the buffer layer 184 are formed. Alternatively, the buffer layer 182, the buffer layer 192, the active layer 113, and the light-emitting layer 193 may be formed in that order, for example.

Structure Example 3 of Imaging Device

A more detailed structure of the imaging device of one embodiment of the present invention will be described below with reference to FIG. 11 to FIG. 15.
[Imaging Device 100A]

Figure 11:
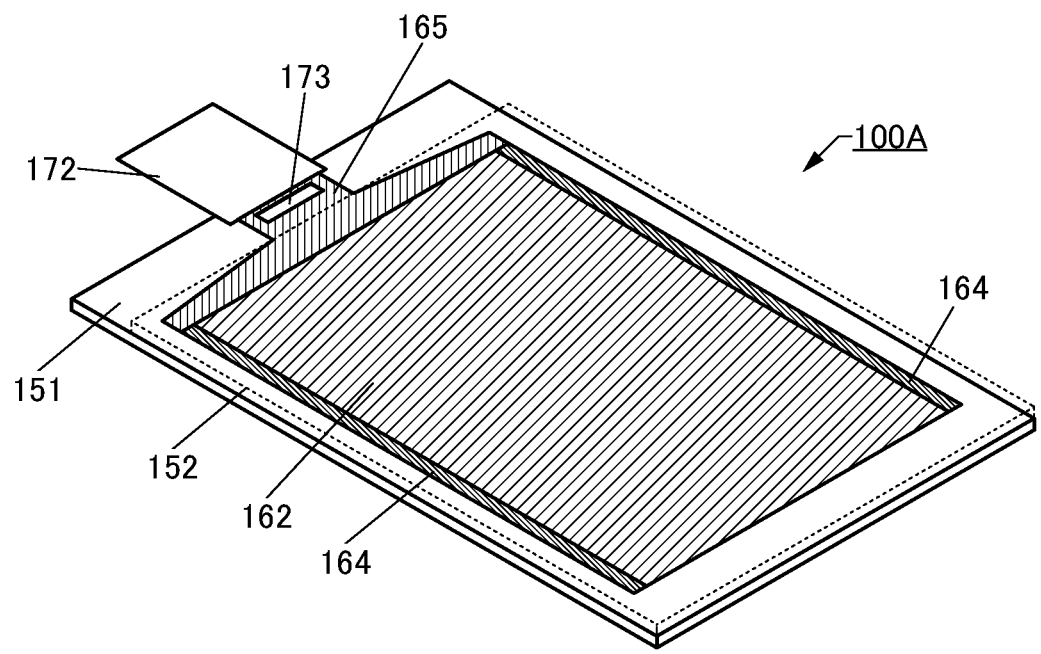
FIG. 11 is a perspective view showing an example of an imaging device.
Figure 12:
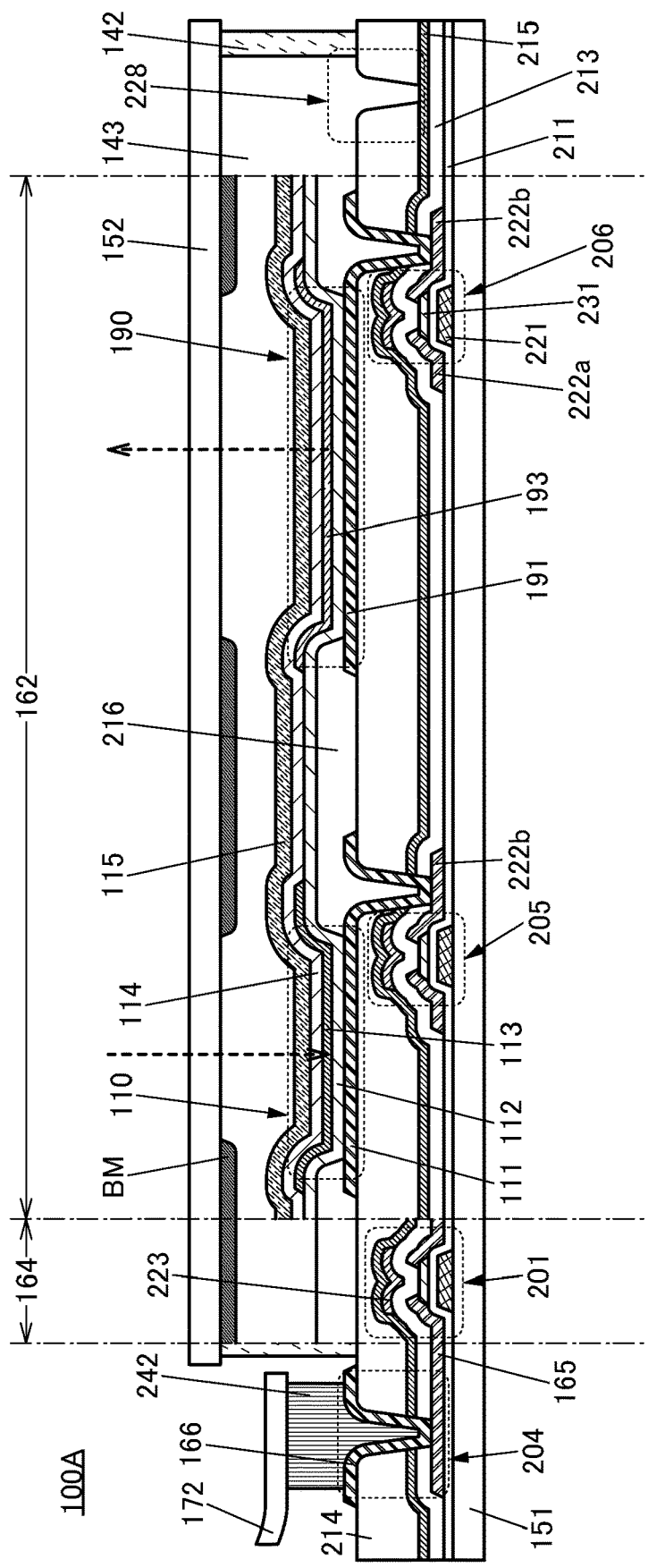
FIG. 12 is a cross-sectional view showing an example of an imaging device.

FIG. 11 is a perspective view of an imaging device 100A, and FIG. 12 is a cross-sectional view of the imaging device 100A.

The imaging device 100A has a structure in which the substrate 152 and the substrate 151 are bonded to each other. In FIG. 11, the substrate 152 is denoted by a dashed line.

The imaging device 100A can also be referred to as an imaging module including any one or more of the imaging device of one embodiment of the present invention, a connector, and an integrated circuit (IC). As the connector, a flexible printed circuit (FPC) board, a tape carrier package (TCP), or the like can also be used. The integrated circuit (IC) can be mounted on the imaging module by a COG (chip on glass) method, a COF (chip on film) method, or the like. FIG. 11 shows an example in which an IC 173 and an FPC 172 are mounted on the imaging device 100A. The imaging device 100A includes an imaging unit 162, a circuit 164, a wiring 165, and the like.

As the circuit 164, for example, a scan line driver circuit can be used.

The wiring 165 has a function of supplying a signal and power to the imaging unit 162 and the circuit 164. The signal and power are input to the wiring 165 from the outside through the FPC 172 or from the IC 173.

FIG. 11 illustrates an example in which the IC 173 is provided over the substrate 151 by a COG method, a COF method, or the like. An IC including a scan line driver circuit, a signal line driver circuit, or the like can be used as the IC 173, for example. Note that the imaging device 100A and the imaging module may have a structure that is not provided with an IC. The IC may be implemented on the FPC by a COF method or the like.

FIG. 12 illustrates an example of a cross section including part of a region including the FPC 172, part of a region including the circuit 164, part of a region including the imaging unit 162, and part of a region including an end portion of the imaging device 100A illustrated in FIG. 11.

The imaging device 100A in FIG. 12 includes a transistor 201, a transistor 205, a transistor 206, the light-emitting device 190, the light-receiving device 110, and the like between the substrate 151 and the substrate 152.

The substrate 152 and the insulating layer 214 are bonded to each other with an adhesive layer 142. A solid sealing structure, a hollow sealing structure, or the like can be employed to seal the light-emitting device 190 and the light-receiving device 110. In FIG. 12, a hollow sealing structure is employed in which a space 143 surrounded by the substrate 152, the adhesive layer 142, and the insulating layer 214 is filled with an inert gas (e.g., nitrogen or argon). The adhesive layer 142 may overlap with the light-emitting device 190. The space 143 surrounded by the substrate 152, the adhesive layer 142, and the insulating layer 214 may be filled with a resin different from that of the adhesive layer 142.

The light-emitting device 190 has a stacked-layer structure in which the pixel electrode 191, the common layer 112, the light-emitting layer 193, the common layer 114, and the common electrode 115 are stacked in this order from the insulating layer 214 side. The pixel electrode 191 is electrically connected to a conductive layer 222b included in the transistor 206 through an opening provided in the insulating layer 214. The transistor 206 has a function of controlling the driving of the light-emitting device 190. An end portion of the pixel electrode 191 is covered with the bank 216. The pixel electrode 191 includes a material that reflects visible light, and the common electrode 115 includes a material that transmits visible light.

The light-receiving device 110 has a stacked-layer structure in which the pixel electrode 111, the common layer 112, the active layer 113, the common layer 114, and the common electrode 115 are stacked in that order from the insulating layer 214 side. The pixel electrode 111 is electrically connected to the conductive layer 222b included in the transistor 205 through an opening provided in the insulating layer 214. An end portion of the pixel electrode 111 is covered with the bank 216. The pixel electrode 111 includes a material that reflects visible light, and the common electrode 115 includes a material that transmits visible light.

Light from the light-emitting device 190 is emitted toward the substrate 152. Light enters the light-receiving device 110 through the substrate 152 and the space 143. For the substrate 152, a material having a high visible-light-transmitting property is preferably used.

The pixel electrode 111 and the pixel electrode 191 can be formed using the same material in the same step. The common layer 112, the common layer 114, and the common electrode 115 are used in both the light-receiving device 110 and the light-emitting device 190. The light-receiving device 110 and the light-emitting device 190 can have common components except the active layer 113 and the light-emitting layer 193. Thus, the light-receiving device 110 and the light-receiving device 110 can be incorporated into the imaging device 100A without a significant increase in the number of manufacturing steps.

A light-blocking layer BM is provided on a surface of the substrate 152, which faces the substrate 151. The light-blocking layer BM has an opening at a position overlapping with the light-receiving device 110 and an opening at a position overlapping with the light-emitting device 190. Providing the light-blocking layer BM can control the range where the light-receiving device 110 senses light. Furthermore, with the light-blocking layer BM, light emitted by the light-emitting device 190 can be prevented from directly entering the light-receiving device 110 without passing through any object. Hence, a sensor with less noise and high sensitivity can be obtained.

The transistor 201, the transistor 205, and the transistor 206 are formed over the substrate 151. These transistors can be fabricated using the same material in the same step.

An insulating layer 211, an insulating layer 213, an insulating layer 215, and the insulating layer 214 are provided in this order over the substrate 151. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that the number of gate insulating layers and the number of insulating layers covering the transistor are not limited and either a single layer or two or more layers may be employed.

A material through which impurities such as water and hydrogen do not easily diffuse is preferably used for at least one of the insulating layers that cover the transistors. Thus, such an insulating layer can serve as a barrier layer. Such a structure can effectively inhibit diffusion of impurities into the transistors from the outside and increase the reliability of the imaging device.

An inorganic insulating film is preferably used as each of the insulating layers 211, 213, and 215. As the inorganic insulating film, for example, a silicon nitride film, a silicon oxynitride film, a silicon oxide film, a silicon nitride oxide film, an aluminum oxide film, or an aluminum nitride film, or the like can be used. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may also be used. A stack including two or more of the above insulating films may also be used.

Here, an organic insulating film often has a lower barrier property than an inorganic insulating film. Therefore, the organic insulating film preferably has an opening in the vicinity of an end portion of the imaging device 100A. This can inhibit entry of impurities from the end portion of the imaging device 100A through the organic insulating film. Alternatively, the organic insulating film may be formed so that its end portion is positioned on the inner side compared to the end portion of the imaging device 100A, to prevent the organic insulating film from being exposed at the end portion of the imaging device 100A.

An organic insulating film is suitable for the insulating layer 214 functioning as a planarization layer. Examples of materials which can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 12, an opening is formed in the insulating layer 214. This can inhibit entry of impurities into the imaging unit 162 from the outside through the insulating layer 214 even when an organic insulating film is used as the insulating layer 214. Consequently, the imaging device 100A can have higher reliability.

Each of the transistors 201, 205, and 206 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the imaging device of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistors 201, 205, and 206. The two gates may be connected to each other and supplied with the same signal to operate the transistor. Alternatively, by supplying a potential for controlling the threshold voltage to one of the two gates and a potential for driving to the other, the threshold voltage of the transistor may be controlled.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

It is preferable that a semiconductor layer of a transistor contain a metal oxide (also referred to as an oxide semiconductor). Alternatively, the semiconductor layer of the transistor may contain silicon. Examples of silicon include amorphous silicon and crystalline silicon (e.g., low-temperature polysilicon or single crystal silicon).

The semiconductor layer preferably contains indium, M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

In the case where the semiconductor layer is an In-M-Zn oxide, a sputtering target used for depositing the In-M-Zn oxide preferably has the atomic proportion of In higher than or equal to the atomic proportion of M. Examples of the atomic ratio of the metal elements in such a sputtering target include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M: Zn=5:1:6, In:M:Zn=5:1:7, In:M:Zn=5:1:8, In:M:Zn=6:1:6, and In:M:Zn=5:2:5.

A target containing a polycrystalline oxide is preferably used as the sputtering target, in which case the semiconductor layer having crystallinity is easily formed. Note that the atomic ratio between metal elements in the formed semiconductor layer may vary from the above atomic ratio between metal elements in the sputtering target in a range of ±40%. For example, in the case where the composition of a sputtering target used for the semiconductor layer is In:Ga: Zn=4:2:4.1 [atomic ratio], the composition of the semiconductor layer to be formed is in some cases in the neighborhood of In:Ga:Zn=4:2:3 [atomic ratio].

Note that when the atomic ratio is described as In:Ga: Zn=4:2:3 or as being in the neighborhood thereof, the case is included where the atomic proportion of Ga is greater than or equal to 1 and less than or equal to 3 and the atomic proportion of Zn is greater than or equal to 2 and less than or equal to 4 with the atomic proportion of In being 4. When the atomic ratio is described as In:Ga:Zn=5:1:6 or as being in the neighborhood thereof, the case is included where the atomic proportion of Ga is greater than 0.1 and less than or equal to 2 and the atomic proportion of Zn is greater than or equal to 5 and less than or equal to 7 with the atomic proportion of In being 5. When the atomic ratio is described as In:Ga:Zn=1:1:1 or as being in the neighborhood thereof, the case is included where the atomic proportion of Ga is greater than 0.1 and less than or equal to 2 and the atomic proportion of Zn is greater than 0.1 and less than or equal to 2 with the atomic proportion of In being 1.

The transistor included in the circuit 164 and the transistor included in the imaging unit 162 may have the same structure or different structures. One structure or two or more kinds of structures may be employed for a plurality of transistors included in the circuit 164. Similarly, one structure or two or more kinds of structures may be employed for a plurality of transistors included in the imaging unit 162.

A connection portion 204 is provided in a region of the substrate 152 not overlapping with the substrate 151. In the connection portion 204, the wiring 165 is electrically connected to the FPC 172 via a connection layer 242 and a conductive layer 166. On the top surface of the connection portion 204, the conductive layer 166 obtained by processing the same conductive film as the pixel electrode 191 is exposed. Thus, the connection portion 204 and the FPC 172 can be electrically connected to each other through the connection layer 242.

Any of a variety of optical members can be arranged on the outer side of the substrate 152. Examples of the optical members include a polarizing plate, a retardation plate, a light diffusion layer (a diffusion film or the like), an anti-reflective layer, and a light-condensing film. Furthermore, an antistatic film preventing the attachment of dust, a water repellent film suppressing the attachment of stain, a hard coat film inhibiting generation of a scratch caused by the use, a shock absorbing layer or the like may be arranged on the outside of the substrate 152.

For each of the substrate 151 and the substrate 152, glass, quartz, ceramic, sapphire, a resin, or the like can be used. When a flexible material is used for the substrate 151 and the substrate 152, the flexibility of the imaging device can be increased.

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-component resin may be used. An adhesive sheet or the like may be used.

As the connection layer 242, an anisotropic conductive film (ACF), an anisotropic conductive paste (ACP), or the like can be used.

The light-emitting device 190 may be a top emission, bottom emission, or dual emission light-emitting device, or the like. A conductive film that transmits visible light is used as the electrode through which light is extracted. A conductive film that reflects visible light is preferably used as the electrode through which no light is extracted.

The light-emitting device 190 includes at least the light-emitting layer 193. In addition to the light-emitting layer 193, the light-emitting device 190 may further include a layer containing a substance with a high hole-injection property, a layer containing a substance with a high hole-transport property, a layer containing a hole-blocking material, a layer containing a substance with a high electron-transport property, a layer containing a substance with a high electron-injection property, a layer containing a substance with a bipolar property (a substance with a high electron- and hole-transport property), or the like. For example, the common layer 112 preferably includes one or both of a hole-injection layer and a hole-transport layer. For example, the common layer 114 preferably includes one or both of an electron-transport layer and an electron-injection layer.

Either a low molecular compound or a high molecular compound can be used for the common layer 112, the light-emitting layer 193, and the common layer 114 and an inorganic compound may also be contained. The layers that constitute the common layer 112, the light-emitting layer 193, and the common layer 114 can each be formed by a method such as an evaporation method (including a vacuum evaporation method), a transfer method, a printing method, an inkjet method, or a coating method.

The light-emitting layer 193 may contain an inorganic compound such as quantum dots as a light-emitting material.

The active layer 113 of the light-receiving device 110 contains a semiconductor. Examples of the semiconductor include an inorganic semiconductor such as silicon and an organic semiconductor including an organic compound. This embodiment shows an example in which an organic semiconductor is used as the semiconductor contained in the active layer. The use of an organic semiconductor is preferable because the light-emitting layer 193 of the light-emitting device 190 and the active layer 113 of the light-receiving device 110 can be formed by the same method (e.g., a vacuum evaporation method) and thus the same manufacturing apparatus can be used.

Examples of an n-type semiconductor material included in the active layer 113 are electron-accepting organic semiconductor materials such as fullerene (e.g., $C_{60}$ and $C_{70}$) and derivatives thereof. As a p-type semiconductor material included in the active layer 113, an electron-donating organic semiconductor material such as copper(II) phthalocyanine (CuPc) or tetraphenyldibenzoperiflanthene (DBP) can be given.

For example, the active layer 113 is preferably formed by co-evaporation of an n-type semiconductor and a p-type semiconductor.

As materials that can be used for conductive layers such as a variety of wirings and electrodes that constitute an imaging device, in addition to a gate, a source, and a drain of a transistor, metals such as aluminum, titanium, chromium, nickel, copper, yttrium, zirconium, molybdenum, silver, tantalum, or tungsten, or an alloy containing any of these metals as its main component can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chromium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used for the conductive layers. For example, when a stacked film of indium tin oxide and an alloy of silver and magnesium, or the like is used, the conductivity can be increased, which is preferable. They can also be used for conductive layers such as a variety of wirings and electrodes that constitute an imaging device, and conductive layers (conductive layers functioning as a pixel electrode or a common electrode) included in a light-receiving device.

As an insulating material that can be used for each insulating layer, for example, a resin such as acrylic or epoxy resin, and an inorganic insulating material such as silicon oxide, silicon oxynitride, silicon nitride oxide, silicon nitride, or aluminum oxide can be given.

[Imaging Device 100B]

FIG. 13A shows a cross section of an imaging device 100B.

The imaging device 100B is different from the imaging device 100A mainly in that the lens 149 and the protective layer 195 are included.

Providing the protective layer 195 covering the light-receiving device 110 and the light-emitting device 190 can inhibit entry of impurities such as water into the light-receiving device 110 and the light-emitting device 190, so that the reliability of the light-receiving device 110 and the light-emitting device 190 can be increased.

In the region 228 in the vicinity of an end portion of the imaging device 100B, the insulating layer 215 and the protective layer 195 are preferably in contact with each other through an opening in the insulating layer 214. In particular, the inorganic insulating film included in the insulating layer 215 and the inorganic insulating film included in the protective layer 195 are preferably in contact with each other. Thus, entry of impurities from the outside into the imaging unit 162 through the organic insulating film can be inhibited. Consequently, the imaging device 100B can have higher reliability.

FIG. 13B illustrates an example in which the protective layer 195 has a three-layer structure. In FIG. 13B, the protective layer 195 includes an inorganic insulating layer 195a over the common electrode 115, an organic insulating layer 195b over the inorganic insulating layer 195a, and an inorganic insulating layer 195c over the organic insulating layer 195b.

An end portion of the inorganic insulating layer 195a and an end portion of the inorganic insulating layer 195c extend beyond an end portion of the organic insulating layer 195b and are in contact with each other. The inorganic insulating layer 195a is in contact with the insulating layer 215 (inorganic insulating layer) through the opening in the insulating layer 214 (organic insulating layer). Accordingly, the light-receiving device 110 and the light-emitting device 190 can be surrounded by the insulating layer 215 and the protective layer 195, whereby the reliability of the light-receiving device 110 and the light-emitting device 190 can be increased.

As described above, the protective layer 195 may have a stacked-layer structure of an organic insulating film and an inorganic insulating film. In that case, an end portion of the inorganic insulating layer preferably extends beyond an end portion of the organic insulating layer.

The lens 149 is provided on the surface of the substrate 152, which faces the substrate 151. The lens 149 has the convex surface on the substrate 151 side. It is preferable that the light-receiving region of the light-receiving device 110 overlap with the lens 149 and do not overlap with the light-emitting layer 193. Thus, the sensitivity and accuracy of a sensor using the light-receiving device 110 can be increased.

The lens 149 preferably has a refractive index greater than or equal to 1.3 and less than or equal to 2.5. The lens 149 can be formed using at least one of an inorganic material and an organic material. For example, a material containing a resin can be used for the lens 149. Moreover, a material containing at least one of an oxide and a sulfide can be used for the lens 149.

Specifically, a resin containing chlorine, bromine, or iodine, a resin containing a heavy metal atom, a resin having an aromatic ring, a resin containing sulfur, and the like can be used for the lens 149. Alternatively, a material containing a resin and nanoparticles of a material having a higher refractive index than the resin can be used for the lens 149. Titanium oxide, zirconium oxide, or the like can be used for the nanoparticles.

Cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens 149. Alternatively, zinc sulfide and the like can be used for the lens 149.

In the imaging device 100B, the protective layer 195 and the substrate 152 are bonded to each other with the adhesive layer 142. The adhesive layer 142 is provided to overlap with the light-receiving device 110 and the light-emitting device 190; that is, the imaging device 100B employs a solid sealing structure.

[Imaging Device 100C]

FIG. 14A shows a cross section of an imaging device 100C.

The imaging device 100C differs from the imaging device 100B in transistor structures.

The imaging device 100C includes a transistor 208, a transistor 209, and a transistor 210 over the substrate 151.

Each of the transistors 208, 209, and 210 includes the conductive layer 221 functioning as a gate, the insulating layer 211 functioning as a gate insulating layer, a semiconductor layer including a channel formation region 231$i$ and a pair of low-resistance regions 231$n$, the conductive layer 222a connected to one of the low-resistance regions 231n, the conductive layer 222b connected to the other low-resistance region 231n, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231i. The insulating layer 225 is positioned between the conductive layer 223 and the channel formation region 231i.

The conductive layer 222a and the conductive layer 222b are each connected to the corresponding low-resistance region 231n through openings provided in the insulating layer 225 and the insulating layer 215. One of the conductive layer 222a and the conductive layer 222b serves as a source, and the other serves as a drain.

The pixel electrode 191 of the light-emitting device 190 is electrically connected to one of the pair of low-resistance regions 231n of the transistor 208 through the conductive layer 222b.

The pixel electrode 111 of the light-receiving device 110 is electrically connected to the other of the pair of low-resistance regions 231n of the transistor 209 through the conductive layer 222b.

In each of the transistor 208, the transistor 209, and the transistor 210 illustrated in FIG. 14A, an example in which the insulating layer 225 covers a top and side surfaces of the semiconductor layer is described. Meanwhile, in the transistor 202 illustrated in FIG. 14B, the insulating layer 225 overlaps with the channel formation region 231i of the semiconductor layer 231 and does not overlap with the low-resistance regions 231n. The structure illustrated in FIG. 14B is obtained by processing the insulating layer 225 with the conductive layer 223 as a mask, for example. In FIG. 14B, the insulating layer 215 is provided to cover the insulating layer 225 and the conductive layer 223, and the conductive layer 222a and the conductive layer 222b are connected to the low-resistance regions 231n through the openings in the insulating layer 215. Furthermore, an insulating layer 218 covering the transistor may be provided.

The imaging device 100C is different from the imaging device 100B in that a colored layer 147 is included.

The colored layer 147 is positioned over the insulating layer 214 and the bank 216 covers the top surface and the side surface of the colored layer 147.

In FIG. 14A, the colored layer 147 and the light-receiving device 110 are provided apart from each other. Similarly, the colored layer 147 and the light-emitting device 190 are provided apart from each other. The position of the colored layer 147 is not limited to the arrangement shown in FIG. 14A. As shown in FIG. 14C, the colored layer 147 may cover one or both of an end portion of the pixel electrode 111 and an end portion of the pixel electrode 191.

In FIG. 14A, the colored layer 147 is provided apart from the light-receiving device 110 and the light-emitting device 190. Thus, the colored layer 147 is less likely to affect the light-receiving device 110 and the light-emitting device 190 even when having low resistivity, which is preferable because the range of choices for materials used for the colored layer 147 is widen.

In FIG. 14C, the colored layer 147 covers the end portion of the pixel electrode 111 and the end portion of the pixel electrode 191; accordingly, the area of the colored layer 147 can be increased. The larger the area where the colored layer 147 is provided is, the more stray light generated in the imaging device is absorbed by the colored layer 147, which is preferable because the amount of stray light entering the light-receiving device 110 can be reduced. Consequently, noise can be reduced, and the sensitivity of a sensor using the light-receiving device 110 can be increased.

[Imaging Device 100D]

Figure 15:
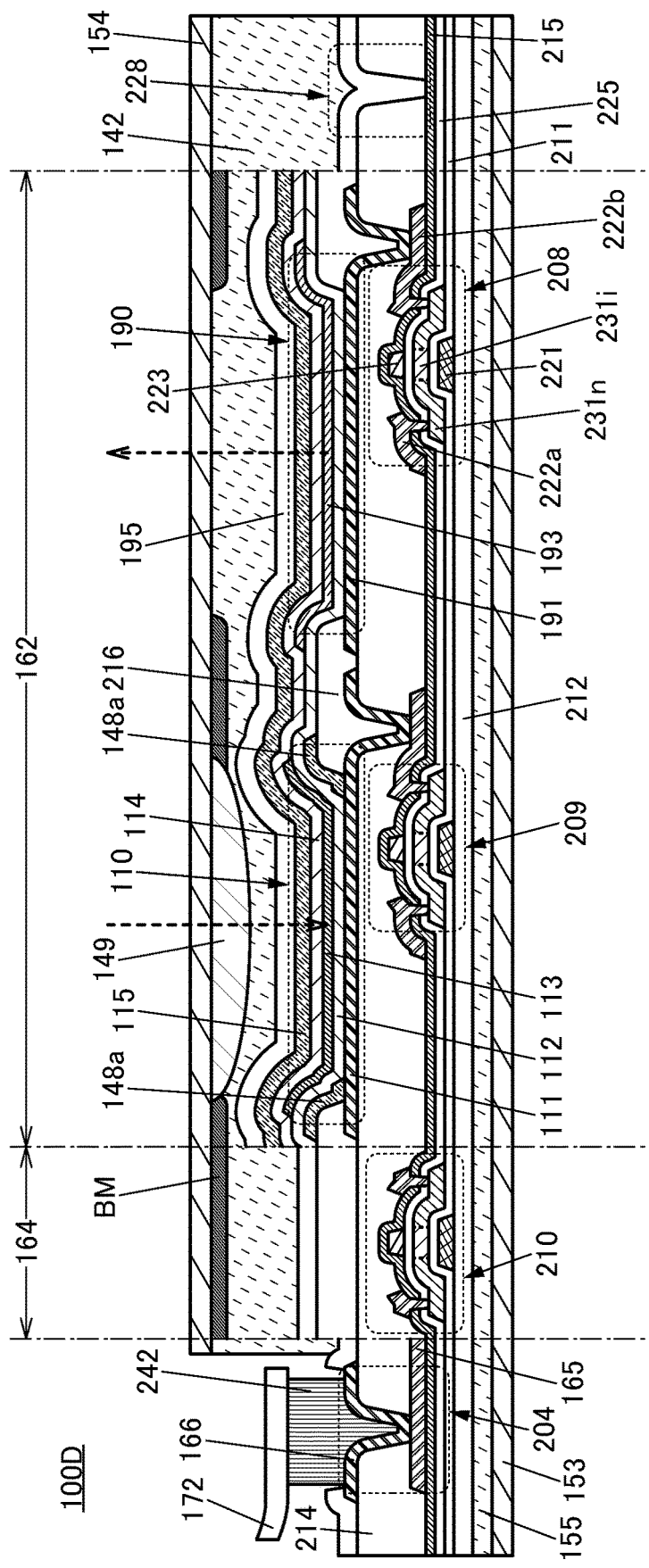
FIG. 15 is a cross-sectional view showing an example of an imaging device.

FIG. 15 shows a cross section of an imaging device 100D.

The imaging device 100D is different from the imaging device 100C in that the colored layer 147 is not included but the colored layer 148a is included.

The colored layer 148a includes a portion in contact with a top surface of the pixel electrode 111 in the light-receiving device 110 and a portion in contact with a side surface of the bank 216.

When the colored layer 148a absorbs stray light generated in the imaging device 100D, the amount of stray light entering the light-receiving device 110 can be reduced. Consequently, noise can be reduced, and the sensitivity of a sensor using the light-receiving device 110 can be increased.

In addition, the imaging device 100D differs from the imaging device 100C in that neither the substrate 151 nor the substrate 152 is included and that the substrate 153, the substrate 154, the adhesive layer 155, and the insulating layer 212 are included.

The substrate 153 and the insulating layer 212 are attached to each other with the adhesive layer 155. The substrate 154 and the protective layer 195 are attached to each other with the adhesive layer 142.

The imaging device 100D is formed in such a manner that the insulating layer 212, the transistor 208, the transistor 209, the transistor 210, the light-receiving device 110, the light-emitting device 190, and the like, which are formed over a formation substrate are transferred onto the substrate 153. The substrate 153 and the substrate 154 are preferably flexible. Accordingly, the flexibility of the imaging device 100D can be increased.

The inorganic insulating film that can be used as the insulating layer 211, the insulating layer 213, and the insulating layer 215 can be used as the insulating layer 212.

The imaging device 100C shows an example in which the lens 149 is not provided, and the imaging device 100D shows an example in which the lens 149 is provided. The lens 149 can be provided as appropriate in accordance with usage of a sensor or the like.

[Metal Oxide]

A metal oxide that can be used for the semiconductor layer will be described below.

Note that in this specification and the like, a metal oxide containing nitrogen is also collectively referred to as a metal oxide in some cases. A metal oxide containing nitrogen may be referred to as a metal oxynitride. For example, a metal oxide containing nitrogen, such as zinc oxynitride (ZnON), may be used for the semiconductor layer.

Note that in this specification and the like, CAAC (c-axis aligned crystal) or CAC (Cloud-Aligned Composite) may be stated. Note that CAAC refers to an example of a crystal structure, and CAC refers to an example of a function or a material composition.

For example, a CAC (Cloud-Aligned Composite)-OS (Oxide Semiconductor) can be used for the semiconductor layer.

A CAC-OS has a conducting function in part of the material and has an insulating function in another part of the material; as a whole, the CAC-OS has a function of a semiconductor. In the case where the CAC-OS is used in a semiconductor layer of a transistor, the conducting function is to allow electrons (or holes) serving as carriers to flow, and the insulating function is to not allow electrons serving as carriers to flow. By the complementary action of the conducting function and the insulating function, a switching function (On/Off function) can be given to the CAC-OS. In the CAC-OS, separation of the functions can maximize each function.

Furthermore, the CAC-OS includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

Furthermore, in the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

Furthermore, the CAC-OS includes components having different bandgaps. For example, the CAC-OS includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS is used in a channel formation region of a transistor, high current driving capability in an on state of the transistor, that is, a high on-state current and high field-effect mobility can be obtained.

In other words, the CAC-OS can also be referred to as a matrix composite or a metal matrix composite.

Oxide semiconductors (metal oxides) are classified into a single crystal oxide semiconductor and a non-single crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

Furthermore, the CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Entry of impurities, formation of defects, or the like might decrease the crystallinity of a metal oxide; thus, it can be said that the CAAC-OS is a metal oxide that has small amounts of impurities and defects (e.g., oxygen vacancies (also referred to as $V_O$)). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that indium-gallium-zinc oxide (hereinafter referred to as IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS contains a void or a low-density region. That is, the a-like OS has low crystallinity as compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

A metal oxide film that functions as a semiconductor layer can be formed using either or both of an inert gas and an oxygen gas. Note that there is no particular limitation on the flow rate ratio of oxygen (the partial pressure of oxygen) at the time of forming the metal oxide film. However, to obtain a transistor having high field-effect mobility, the flow rate ratio of oxygen (the partial pressure of oxygen) at the time of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The energy gap of the metal oxide is preferably 2 eV or more, further preferably 2.5 eV or more, still further preferably 2.7 eV or more. With use of a metal oxide having such a wide energy gap, the off-state current of the transistor can be reduced.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C. The substrate temperature during the deposition of the metal oxide film is preferably room temperature because productivity can be increased.

The metal oxide film can be formed by a sputtering method. Alternatively, a PLD method, a PECVD method, a thermal CVD method, an ALD method, or a vacuum evaporation method, for example, may be used.

As described above, the imaging device of this embodiment includes a light-receiving device and a light-emitting device in an imaging unit. Thus, the size and weight of an electronic device can be reduced as compared to the case where a light-emitting device is provided outside an imaging unit.

In the light-receiving device, at least one of layers other than the active layer can be common to a layer in the light-emitting device (EL element). In the light-receiving device, all of the layers other than the active layer can be common to the layers in the light-emitting device (EL element). For example, with only the addition of the step of forming the active layer to the manufacturing process of the light-emitting device, the light-emitting device and the light-receiving device can be formed over one substrate. In the light-receiving device and the light-emitting device, their pixel electrodes can be formed using the same material in the same step, and their common electrodes can be formed using the same material in the same step. When a circuit electrically connected to the light-receiving device and a circuit electrically connected to the light-emitting device are formed using the same material in the same process, the manufacturing process of the imaging device can be simplified. In such a manner, an imaging device that incorporates a light-receiving device and is highly convenient can be manufactured without complicated steps.

The imaging device of this embodiment includes a coloring layer between a light-receiving device and a light-emitting device. The colored layer may serve as a bank which electrically isolates the light-receiving device from the light-emitting device. Since the colored layer can absorb stray light in the display device, the sensitivity of a sensor using a light-receiving device can be increased.

This embodiment can be combined with the other embodiments as appropriate. In this specification, in the case where a plurality of structure examples are shown in one embodiment, the structure examples can be combined as appropriate.

Embodiment 2

In this embodiment, an imaging device of one embodiment of the present invention will be described with reference to FIG. 16.

An imaging device of one embodiment of the present invention includes first pixel circuits including a light-receiving device and second pixel circuits including a light-emitting device. The first pixel circuits and the second pixel circuits are arranged in a matrix.

Figure 16A:
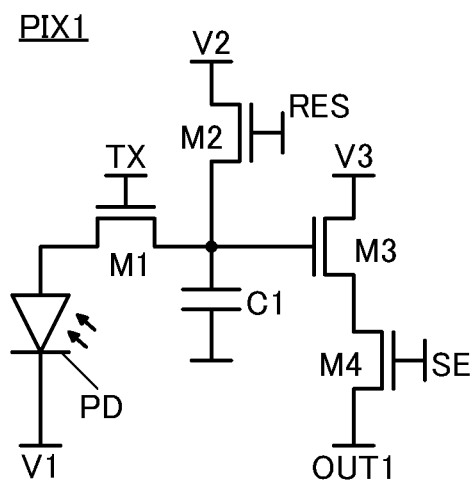
FIG. 16A and FIG. 16B are circuit diagrams each showing an example of a pixel circuit.
Figure 16B:
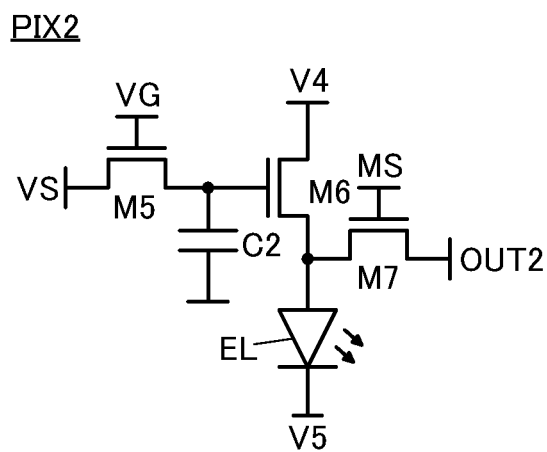

FIG. 16A illustrates an example of the first pixel circuit including a light-receiving device. FIG. 16B illustrates an example of the second pixel circuit including a light-emitting device.

A pixel circuit PIX1 illustrated in FIG. 16A includes a light-receiving device PD, a transistor M1, a transistor M2, a transistor M3, a transistor M4, and a capacitor C1. Here, an example of the case where a photodiode is used as the light-receiving device PD is illustrated.

A cathode of the light-receiving device PD is electrically connected to a wiring V1, and an anode is electrically connected to one of a source and a drain of the transistor M1. A gate of the transistor M1 is electrically connected to a wiring TX, and the other of the source and the drain is electrically connected to one electrode of the capacitor C1, one of a source and a drain of the transistor M2, and a gate of the transistor M3. A gate of the transistor M2 is electrically connected to a wiring RES, and the other of the source and the drain is electrically connected to a wiring V2. One of a source and a drain of the transistor M3 is electrically connected to a wiring V3, and the other of the source and the drain is electrically connected to one of a source and a drain of the transistor M4. A gate of the transistor M4 is electrically connected to a wiring SE, and the other of the source and the drain is electrically connected to a wiring OUT1.

A constant potential can be supplied to the wiring V1, the wiring V2, and the wiring V3. When the light-receiving device PD is driven with a reverse bias, the wiring V2 can be supplied with a potential lower than the potential of the wiring V1. The transistor M2 is controlled by a signal supplied to the wiring RES and has a function of resetting the potential of a node connected to the gate of the transistor M3 to a potential supplied to the wiring V2. The transistor M1 is controlled by a signal supplied to the wiring TX and has a function of controlling the timing at which the potential of the node changes, in accordance with a current flowing through the light-receiving device PD. The transistor M3 functions as an amplifier transistor for performing output in response to the potential of the node. The transistor M4 is controlled by a signal supplied to the wiring SE and functions as a selection transistor for reading an output corresponding to the potential of the node by an external circuit connected to the wiring OUT1. Note that the connection relationship between the cathode and the anode of the light-receiving device PD in FIG. 16A may be reversed.

A pixel circuit PIX2 illustrated in FIG. 16B includes a light-emitting device EL, a transistor M5, a transistor M6, a transistor M7, and a capacitor C2. Here, an example in which a light-emitting diode is used as the light-emitting device EL is illustrated. In particular, an organic EL element is preferably used as the light-emitting device EL.

A gate of the transistor M5 is electrically connected to a wiring VG, one of a source and a drain is electrically connected to a wiring VS, and the other of the source and the drain is electrically connected to one electrode of the capacitor C2 and a gate of the transistor M6. One of a source and a drain of the transistor M6 is electrically connected to a wiring V4, and the other of the source and the drain is electrically connected to an anode of the light-emitting device EL and one of a source and a drain of the transistor M7. A gate of the transistor M7 is electrically connected to a wiring M5, and the other of the source and the drain is electrically connected to a wiring OUT2. A cathode of the light-emitting device EL is electrically connected to a wiring V5.

A constant potential is supplied to the wiring V4 and the wiring V5. In the light-emitting device EL, the anode side can have a high potential and the cathode side can have a lower potential than the anode side. The transistor M5 is controlled by a signal supplied to the wiring VG and functions as a selection transistor for controlling a selection state of the pixel circuit PIX2. The transistor M6 functions as a driving transistor that controls a current flowing through the light-emitting device EL in accordance with a potential supplied to the gate. When the transistor M5 is in an on state, a potential supplied to the wiring VS is supplied to the gate of the transistor M6, and the emission luminance of the light-emitting device EL can be controlled in accordance with the potential. The transistor M7 is controlled by a signal supplied to the wiring MS and has a function of outputting a potential between the transistor M6 and the light-emitting device EL to the outside through the wiring OUT2.

The wiring V1, to which the cathode of the light-receiving device PD is electrically connected, and the wiring V5, to which the cathode of the light-emitting device EL is electrically connected, can be provided in the same layer and have the same level of potential.

Note that in the imaging device of this embodiment, the light-emitting device may be made to emit light in a pulsed manner so as to display an image. A reduction in the driving time of the light-emitting device can reduce power consumption of the display device and suppress heat generation of the display device. An organic EL element is particularly preferable because of its favorable frequency characteristics. The frequency can be higher than or equal to 1 kHz and lower than or equal to 100 MHz, for example.

Here, a transistor in which a metal oxide (an oxide semiconductor) is used in a semiconductor layer where a channel is formed is preferably used as the transistor M1, the transistor M2, the transistor M3, and the transistor M4 included in the pixel circuit PIX1 and the transistor M5, the transistor M6, and the transistor M7 included in the pixel circuit PIX2.

A transistor using a metal oxide having a wider band gap and a lower carrier density than silicon can achieve an extremely low off-state current. Thus, such a low off-state current enables retention of charges accumulated in a capacitor that is connected in series with the transistor for a long time. Therefore, it is particularly preferable to use a transistor using an oxide semiconductor as the transistor M1, the transistor M2, and the transistor M5 each of which is connected in series with the capacitor C1 or the capacitor C2. Moreover, the use of transistors using an oxide semiconductor as the other transistors can reduce the manufacturing cost.

Alternatively, transistors using silicon as a semiconductor in which a channel is formed can be used as the transistor M1 to the transistor M7. In particular, the use of silicon with high crystallinity, such as single crystal silicon or polycrystalline silicon, is preferable because high field-effect mobility is achieved and higher-speed operation is possible.

Alternatively, a transistor using an oxide semiconductor may be used as one or more of the transistor M1 to the transistor M7, and transistors using silicon may be used as the other transistors.

Although n-channel transistors are shown as the transistors in FIG. 16A and FIG. 16B, p-channel transistors can be used as appropriate.

The transistors included in the pixel circuit PIX1 and the transistors included in the pixel circuit PIX2 are preferably formed side by side over the same substrate. It is particularly preferable that the transistors included in the pixel circuits PIX1 and the transistors included in the pixel circuits PIX2 be periodically arranged in one region.

One or more layers including the transistor and/or the capacitor are preferably provided to overlap with the light-receiving device PD or the light-emitting device EL. Thus, the effective area of each pixel circuit can be reduced, and a high-definition imaging unit can be achieved.

This embodiment can be combined with the other embodiments as appropriate.

Embodiment 3

In this embodiment, electronic devices of one embodiment of the present invention will be described with reference to FIG. 17 to FIG. 19.

An electronic device in this embodiment is provided with the imaging device of one embodiment of the present invention. For example, the imaging device of one embodiment of the present invention can be used in a display portion of the electronic device. The imaging device of one embodiment of the present invention has a function of sensing light, and thus can perform biological authentication with the display portion or detect a touch or a near touch on the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 17A:
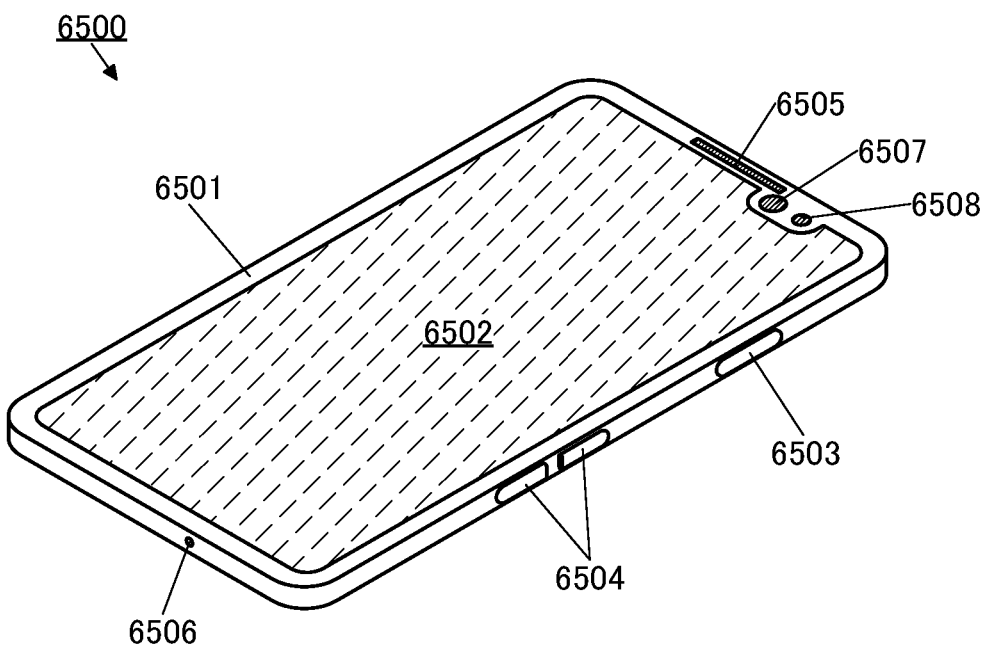
FIG. 17A and FIG. 17B are diagrams showing an example of an electronic device.

An electronic device 6500 illustrated in FIG. 17A is a portable information terminal that can be used as a smartphone.

The electronic device 6500 includes a housing 6501, a display portion 6502, a power button 6503, operation buttons 6504, a speaker 6505, a microphone 6506, a camera 6507, a light source 6508, and the like. The display portion 6502 has a touch panel function.

The imaging device of one embodiment of the present invention can be used in the display portion 6502.

Figure 17B:
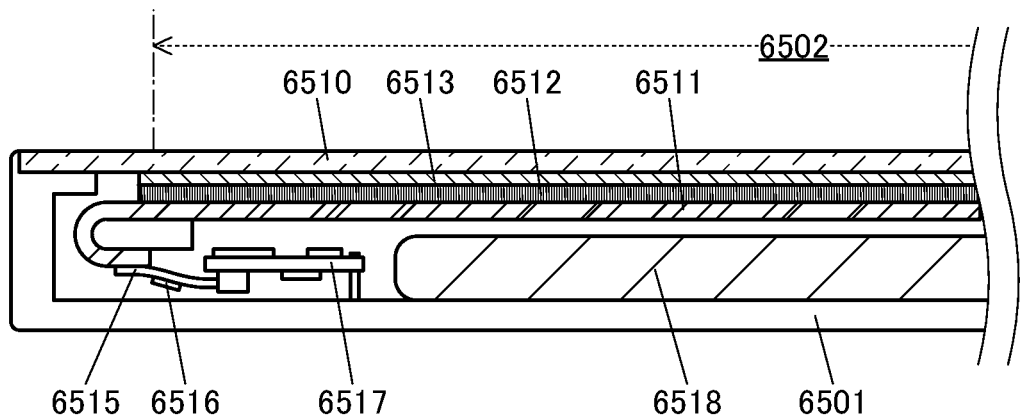

FIG. 17B is a schematic cross-sectional view including an end portion of the housing 6501 on the microphone 6506 side.

A protection member 6510 having a light-transmitting property is provided on a display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not shown).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be provided. Since the display panel 6511 is extremely thin, the battery 6518 with high capacity can be mounted with the thickness of the electronic device controlled. An electronic device with a narrow frame can be obtained when part of the display panel 6511 is folded back so that the portion connected to the FPC 6515 is positioned on the rear side of a pixel portion.

Figure 18A:
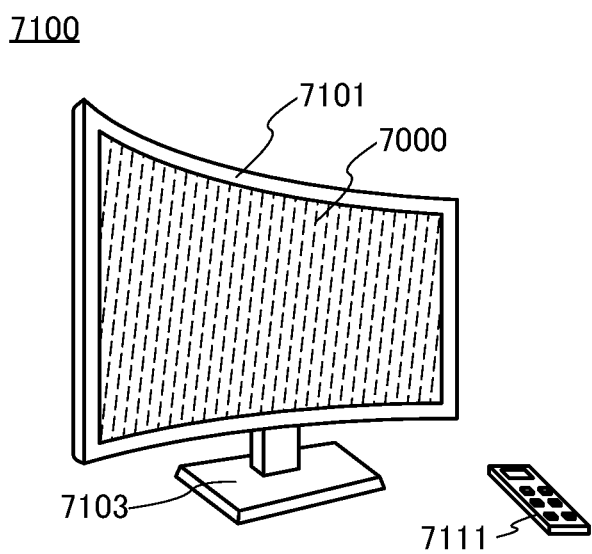
FIG. 18A to FIG. 18D are diagrams showing examples of electronic devices.

FIG. 18A illustrates an example of a television device. In a television device 7100, a display portion 7000 is incorporated in a housing 7101. Here, a structure in which the housing 7101 is supported by a stand 7103 is illustrated.

The imaging device of one embodiment of the present invention can be used in the display portion 7000.

Operation of the television device 7100 illustrated in FIG. 18A can be performed with an operation switch provided in the housing 7101 or a separate remote controller 7111. Alternatively, the display portion 7000 may include a touch sensor, and the television device 7100 may be operated by touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 18B:
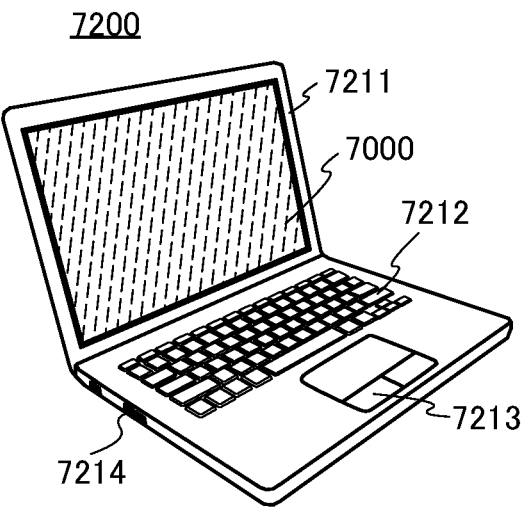

FIG. 18B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

The imaging device of one embodiment of the present invention can be used in the display portion 7000.

Figure 18C:
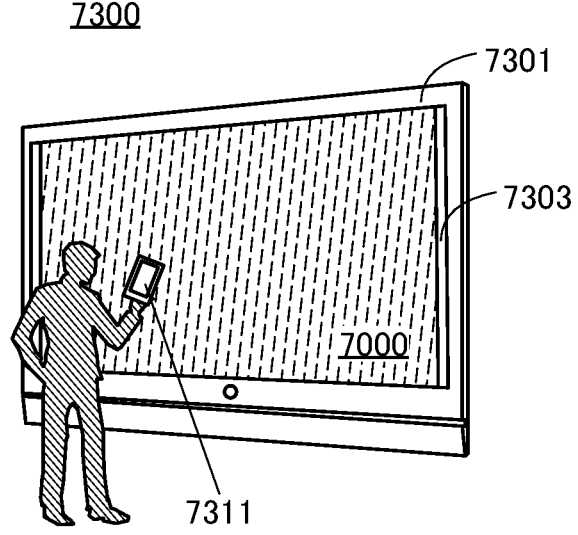
Figure 18D:
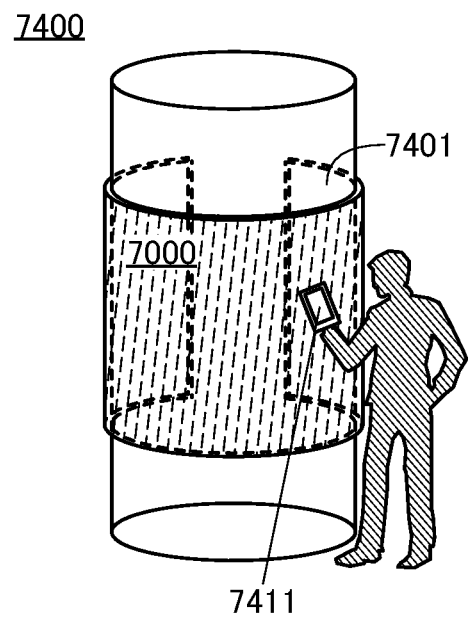

FIG. 18C and FIG. 18D illustrate examples of digital signage.

Digital signage 7300 illustrated in FIG. 18C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 18D is digital signage 7400 attached to a cylindrical pillar 7401. The digital signage 7400 includes the display portion 7000 provided along a curved surface of the pillar 7401.

The imaging device of one embodiment of the present invention can be used for the display portion 7000 in FIG. 18C and FIG. 18D.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 18C and FIG. 18D, it is preferable that the digital signage 7300 or the digital signage 7400 can work with an information terminal 7311 or an information terminal 7411 such as a smartphone a user has through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices shown in FIG. 19A to FIG. 19F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices shown in FIG. 19A to FIG. 19F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 19A to FIG. 19F are described below.

Figure 19A:
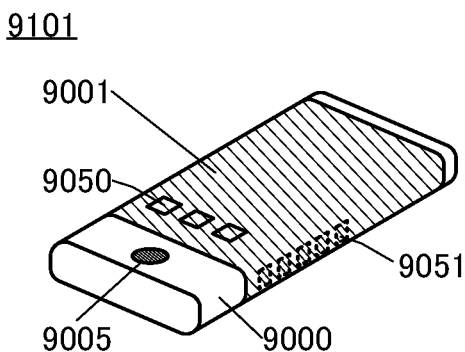
FIG. 19A to FIG. 19F are diagrams showing examples of electronic devices.

FIG. 19A is a perspective view showing a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display characters and image information on its plurality of surfaces. FIG. 19A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

Figure 19B:
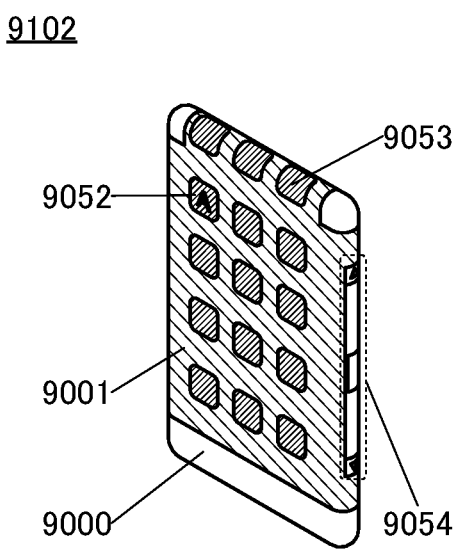

FIG. 19B is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

Figure 19C:
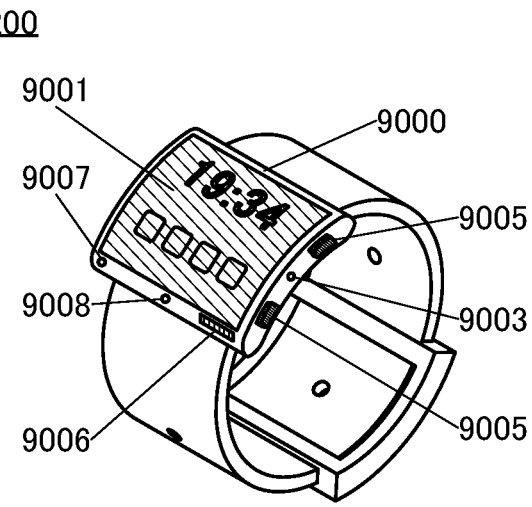

FIG. 19C is a perspective view showing a watch-type portable information terminal 9200. For example, the portable information terminal 9200 can be used as a smart watch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform mutual data transmission with another information terminal and charging. Note that the charging operation may be performed by wireless power feeding.

Figure 19D:
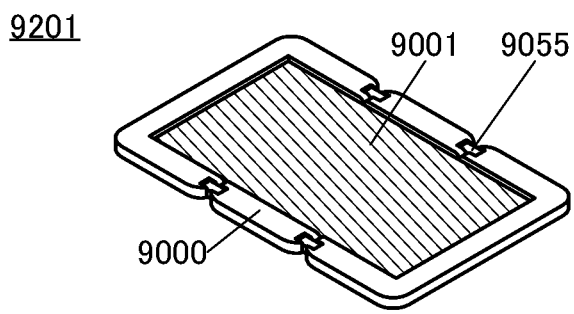
Figure 19E:
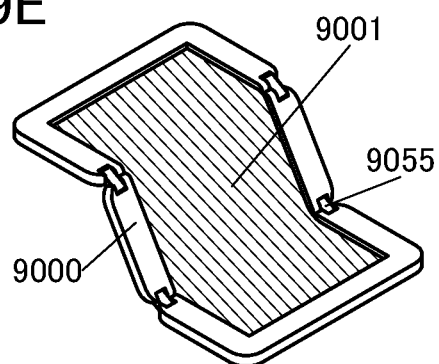
Figure 19F:
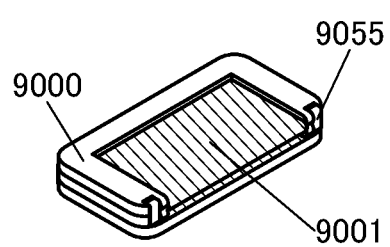

FIG. 19D, FIG. 19E, and FIG. 19F are perspective views showing a foldable portable information terminal 9201. FIG. 19D is a perspective view of an opened state of the portable information terminal 9201, FIG. 19F is a perspective view of a folded state thereof, and FIG. 19E is a perspective view of a state in the middle of change from one of FIG. 19D and FIG. 19F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be folded with a radius of curvature greater than or equal to 0.1 mm and less than or equal to 150 mm.

This embodiment can be combined with the other embodiments as appropriate.

REFERENCE NUMERALS

BM: light-blocking layer, EL: light-emitting device, PD: light-receiving device, 10A: imaging device, 10B: imaging device, 10C: imaging device, 10D: imaging device, 10E: imaging device, 10F: imaging device, 10G: imaging device, 10H: imaging device, 10J: imaging device, 10K: imaging device, 10L: imaging device, 10M: imaging device, 10: imaging device, 21: light-emitting, 22: light, 23a: light, 23b: reflected light, 23c: light, 23d: reflected light, 41: transistor, 42: transistor, 51: substrate, 52: subject, 53: layer, 55: layer, 57: layer, 59: substrate, 60B: subpixel, 60G: subpixel, 60PD: subpixel, 60R: subpixel, 60W: subpixel, 60: pixel, 61: imaging unit, 62: driver circuit portion, 63: driver circuit portion, 64: driver circuit portion, 65: circuit portion, 71: arithmetic circuit, 73: memory, 82: wiring, 83: wiring, 84: wiring, 85: wiring, 86: wiring, 87: wiring, 91B: light-emitting device, 91G: light-emitting device, 91PD: light-receiving device, 91R: light-emitting device, 91W: light-emitting device, 100A: imaging device, 100B: imaging device, 100C: imaging device, 100D: imaging device, 110: light-receiving device, 111: pixel electrode, 112: common layer, 113: active layer, 114: common layer, 115: common electrode, 142: adhesive layer, 143: space, 146: lens array, 147: coloring layer, 148a: coloring layer, 148b: coloring layer, 148c: coloring layer, 148: coloring layer, 149: lens, 151: substrate, 152: substrate, 153: substrate, 154: substrate, 155: adhesive layer, 162: imaging unit, 164: circuit, 165: wiring, 166: conductive layer, 172: FPC, 173: IC, 182: buffer layer, 184: buffer layer, 190: light-emitting device, 191: pixel electrode, 192: buffer layer, 193: light-emitting layer, 194: buffer layer, 195a: inorganic insulating layer, 195b: organic insulating layer, 195c: inorganic insulating layer, 195: protective layer, 201: transistor, 202: transistor, 204: connection portion, 205: transistor, 206: transistor, 208: transistor, 209: transistor, 210: transistor, 211: insulating layer, 212: insulating layer, 213: insulating layer, 214: insulating layer, 215: insulating layer, 216: bank, 217: bank, 218: insulating layer, 221: conductive layer, 222a: conductive layer, 222b: conductive layer, 223: conductive layer, 225: insulating layer, 228: region, 231i: channel formation region, 231n: low-resistance region, 231: semiconductor layer, 242: connection layer, 6500: electronic device, 6501: housing, 6502: display portion, 6503: power button, 6504: operation button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television, 7101: housing, 7103: stand, 7111: remote controller, 7200: laptop, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: control key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. An imaging device comprising:
an imaging unit;
a memory; and
an arithmetic circuit,
wherein the imaging unit comprises a light-receiving device, a first light-emitting device, and a second light-emitting device,
wherein the first light-emitting device is configured to emit light in a wavelength range that is different from a wavelength range of light emitted by the second light-emitting device,
wherein the imaging unit is configured to make the first light-emitting device emit light and acquire first image data, wherein the imaging unit is configured to make the second light-emitting device emit light and acquire second image data, wherein the memory is configured to retain first reference data and second reference data, wherein the arithmetic circuit is configured to correct the first image data with the use of the first reference data retained in the memory and calculate first correction image data, wherein the arithmetic circuit is configured to correct the second image data with the use of the second reference data retained in the memory and calculate second correction image data, wherein the arithmetic circuit is configured to combine the first correction image data and the second correction image data to generate synthesized image data, wherein the light-receiving device comprises a first pixel electrode, wherein the first light-emitting device comprises a second pixel electrode on the same plane as the first pixel electrode, and wherein each of the first reference data and the second reference data comprises any one of black reference data and white reference data.

2. The imaging device according to claim 1,
wherein the light-receiving device comprises an active layer and a common electrode,
wherein the first light-emitting device comprises a light-emitting layer and the common electrode,
wherein the active layer is over the first pixel electrode,
wherein the active layer comprises a first organic compound,
wherein the light-emitting layer is over the second pixel electrode,
wherein the light-emitting layer comprises a second organic compound, and
wherein the common electrode comprises a portion overlapping with the first pixel electrode with the active layer therebetween and a portion overlapping with the second pixel electrode with the light-emitting layer therebetween.

3. The imaging device according to claim 1,
wherein the imaging unit comprises a lens,
wherein the lens comprises a portion overlapping with the light-receiving device,
wherein the lens is over the first pixel electrode, and
wherein light passing through the lens enters the light-receiving device.

4. An imaging module comprising:
the imaging device according to claim 1; and
at least any one or more of a connector and an integrated circuit.

5. An electronic device comprising:
the imaging module according to claim 4; and
at least any one or more of an antenna, a battery, a housing, a camera, a speaker, a microphone, and an operation button.

6. An imaging method comprising:
the step of making a first light-emitting device emit light and acquiring first image data;
the step of correcting the first image data with the use of first reference data and calculating first correction image data;
the step of making a second light-emitting device emit light and acquiring second image data;
the step of correcting the second image data with the use of second reference data and calculating second correction image data; and
the step of combining the first correction image data and the second correction image data and generating synthesized image data,
wherein the first light-emitting device is configured to emit light in a wavelength range that is different from a wavelength range of light emitted by the second light-emitting device, and
wherein the first reference data comprises white reference data and black reference data.

* * * * *